(12) United States Patent
Doru et al.

(10) Patent No.: US 12,424,287 B2
(45) Date of Patent: Sep. 23, 2025

(54) MEMORY READ VOLTAGE THRESHOLD TRACKING BASED ON MEMORY DEVICE-ORIGINATED METRICS CHARACTERIZING VOLTAGE DISTRIBUTIONS

(71) Applicant: MICRON TECHNOLOGY, INC., Boise, ID (US)

(72) Inventors: Shantilal Rayshi Doru, San Diego, CA (US); Patrick R. Khayat, San Diego, CA (US); Steven Michael Kientz, Westminster, CO (US); Sampath K. Ratnam, San Jose, CA (US); Dung Viet Nguyen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 18/507,387

(22) Filed: Nov. 13, 2023

(65) Prior Publication Data
US 2024/0161836 A1     May 16, 2024

Related U.S. Application Data

(60) Provisional application No. 63/425,535, filed on Nov. 15, 2022.

(51) Int. Cl.
| G06F 12/02 | (2006.01) |
| G11C 16/34 | (2006.01) |
| G11C 11/56 | (2006.01) |
| G11C 16/04 | (2006.01) |
| G11C 16/26 | (2006.01) |

(52) U.S. Cl.
CPC ...... *G11C 16/3404* (2013.01); *G06F 12/0246* (2013.01); *G11C 11/5642* (2013.01); *G11C 16/0483* (2013.01); *G11C 16/26* (2013.01)

(58) Field of Classification Search
CPC ............ G06F 12/0246; G11C 11/5642; G11C 16/0483; G11C 16/26; G11C 16/3404
USPC ..................................................... 365/185.24
See application file for complete search history.

(56) References Cited

U.S. PATENT DOCUMENTS

| 8,072,805 | B2 | 12/2011 | Chou et al. |
| 8,284,612 | B2 | 10/2012 | Yoshihara et al. |
| 8,913,444 | B1 * | 12/2014 | Gilbert ................ G11C 13/0011 365/189.14 |
| 9,852,804 | B2 | 12/2017 | Park et al. |
| 10,991,444 | B1 * | 4/2021 | Bazarsky ............... G11C 29/52 |
| 2010/0031096 | A1 | 2/2010 | Di Iorio et al. |

(Continued)

*Primary Examiner* — Ly D Pham
(74) *Attorney, Agent, or Firm* — Lowenstein Sandler LLP

(57) ABSTRACT

Described are systems and methods for memory read threshold tracking based on memory device-originated metrics characterizing voltage distributions. An example memory device includes: a memory array having a plurality of memory cells and a controller coupled to the memory array. The controller is to perform operations including: receiving a first value of a metric characterizing threshold voltage distributions of a subset of a set of the plurality of memory cells; determining a first voltage threshold adjustment value; receiving a second value of the metric; determining a second voltage threshold adjustment value; and applying the second voltage threshold adjustment value for reading the set of the plurality of memory cells.

20 Claims, 17 Drawing Sheets

(56) References Cited

U.S. PATENT DOCUMENTS

| | | | |
|---|---|---|---|
| 2012/0063227 A1* | 3/2012 | Weingarten | G11C 16/3404 |
| | | | 365/185.24 |
| 2013/0305124 A1 | 11/2013 | Scheppler et al. | |
| 2015/0378815 A1 | 12/2015 | Goda et al. | |
| 2016/0148701 A1 | 5/2016 | Karakulak et al. | |
| 2017/0162272 A1 | 6/2017 | Kavalipurapu et al. | |
| 2018/0067666 A1 | 3/2018 | D'Abreu | |
| 2020/0066354 A1* | 2/2020 | Ioannou | G11C 16/26 |
| 2020/0090763 A1 | 3/2020 | Tokutomi et al. | |
| 2023/0005550 A1 | 1/2023 | Park | |
| 2023/0176741 A1* | 6/2023 | McNeil | G06F 3/0613 |
| | | | 711/154 |
| 2023/0395170 A1* | 12/2023 | Rayaprolu | G11C 29/021 |
| 2024/0029801 A1* | 1/2024 | Nguyen | G11C 29/021 |

\* cited by examiner

MEMORY READ VOLTAGE THRESHOLD TRACKING BASED ON MEMORY DEVICE-ORIGINATED METRICS CHARACTERIZING VOLTAGE DISTRIBUTIONS

RELATED APPLICATIONS

This application claims the benefit of U.S. Provisional Patent Application No. 63/425,535, filed Nov. 15, 2022, the entire contents of which are incorporated by reference herein.

TECHNICAL FIELD

Embodiments of the disclosure relate generally to memory sub-systems, and more specifically, to memory read voltage threshold tracking based on memory device-originated metrics characterizing voltage distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
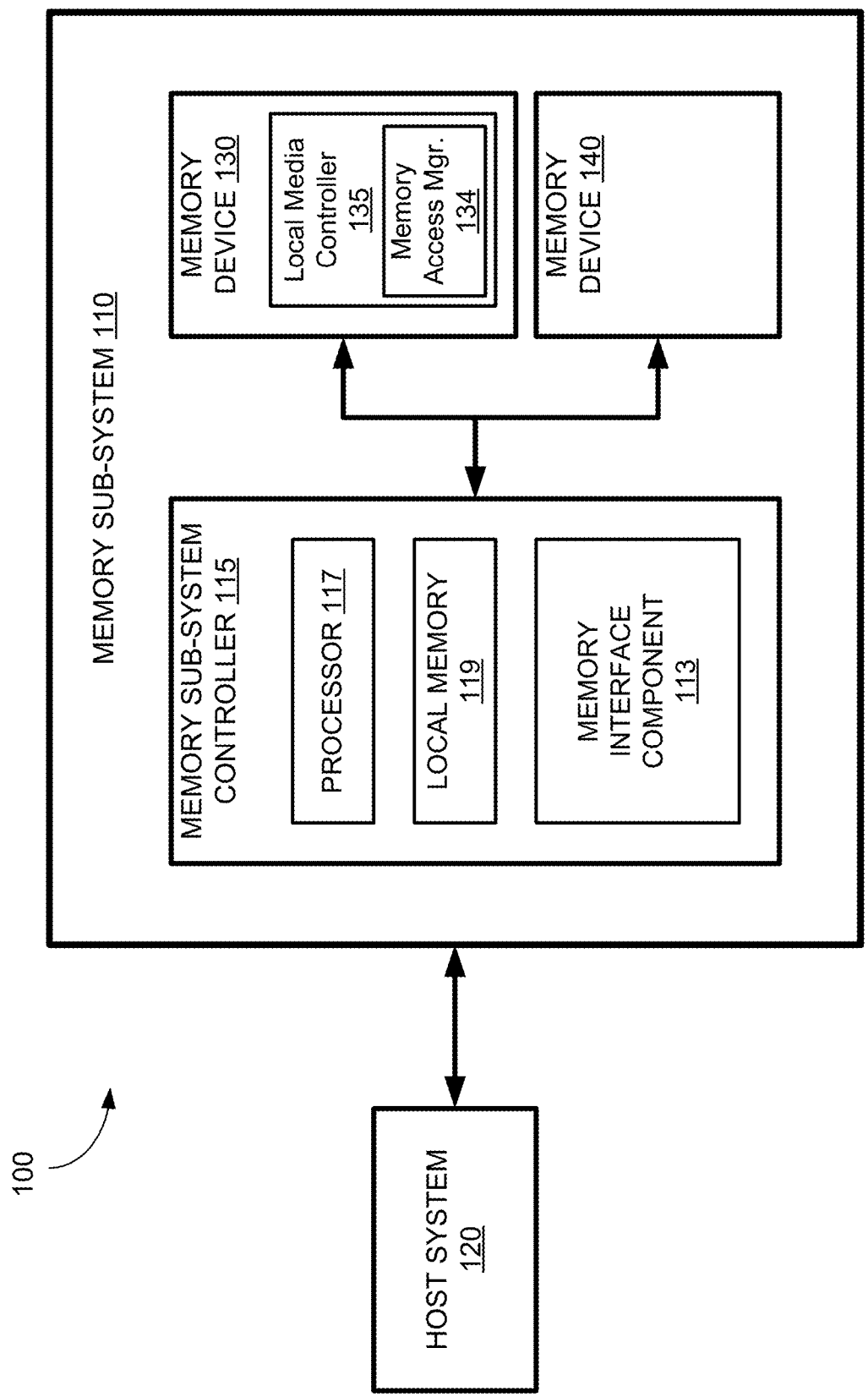
FIG. 1 illustrates an example computing system that includes a memory sub-system in accordance with some implementations of the present disclosure.

Aspects of the present disclosure are directed to memory read voltage threshold calibration based on memory device-originated metrics characterizing voltage distributions.

One or more memory devices can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a NOT-AND (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels (e.g., threshold voltages) in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels (e.g., voltage thresholds) of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and quad level cells (QLC) physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

A memory device typically experiences random workloads and operating conditions, which can impact the threshold voltage distributions causing them to shift to higher or lower values. In order to compensate for various voltage distribution shifts, calibration operations can be performed in order to adjust the read levels (e.g., the adjust voltage thresholds). In some implementations, the adjustment can be performed based on values of one or more data state metrics obtained from a sequence of read and/or write operations. In an illustrative example, the data state metric can be represented by a raw bit error rate (RBER), which is the ratio of the number of erroneous bits to the number of all data bits stored in a certain portion of the memory device (e.g., in a specified data block). In some implementations, sweep reads can be performed in order to create RBER/log likelihood ratio (LLR) profiles to error correction coding (ECC) and select the most efficient profile. However, these and other calibration techniques can exhibit pure accuracy and/or high latency. Furthermore, such techniques can be effectively "blind" with respect to the voltage distribution, which means that the threshold voltage estimate produced by such calibration techniques could gradually drift into the wrong voltage distribution valley, thus making the read data uncorrectable.

Implementations of the present disclosure address the above-referenced and other deficiencies by utilizing memory device-originated metrics characterizing voltage distributions for adjusting read voltage thresholds. In some embodiments, the memory sub-system controller or a local media controller ("the controller") can utilize the memory device-originated metrics characterizing voltage distributions for adjusting the read voltage thresholds in a manner that would minimize the read operation latency while providing at least a specified accuracy (e.g., a chosen error metric not exceeding a threshold value) of the read operation. The final read voltage threshold adjustment can be determined through an iterative process using multiple calibration operations based on the memory device-originated metrics characterizing voltage distributions. In some implementations, the controller can utilize the memory device-originated metrics characterizing voltage distributions for adjusting the read voltage threshold in a manner that would maximize the read operation accuracy (e.g., voltage threshold accuracy) while not exceeding a specified latency of the read operation.

The methods of the present disclosure utilize metrics that are returned by the memory device in response to a read strobe. "Read strobe" herein refers to an act of applying a voltage threshold level to a chosen wordline thus identifying the memory cells having their respective voltages below and/or above the applied threshold voltage. A read operation can include one or more read strobes. In some implementations, the controller can perform read voltage threshold calibration (i.e., adjusting the read voltage thresholds) as part of a read command flow.

In some implementations, the memory device may, upon performing a read strobe, return one or more metrics (e.g., metadata values) that reflect the conductive state of a subset of bitlines that are connected to memory cells forming at least a portion of a specified memory page. Accordingly, the metrics can be generated for the whole memory page or only for a portion of the memory page (in order to reduce latency). In some implementations, the physical boundary of the portion of memory page for which the metadata is obtained is configurable.

In some implementations, the controller can utilize the one or more returned metrics to index a data structure (e.g., a lookup table) mapping memory device-originated metrics to the voltage threshold adjustment values. Alternatively, the controller can compute the voltage threshold adjustment value by applying a predefined mathematical transformation to the memory device-originated metrics. In some implementations, the controller can index the data structure to determine a first voltage threshold adjustment during a first calibration operation, and/or apply a predefined mathematical transformation to determine a second voltage threshold adjustment during a second calibration operation. The controller can then utilize the determined voltage threshold adjustment value for performing subsequent read operations.

In an illustrative example, the metrics can include the failed byte count (CFByte), which reflects (i.e., is equal to or is derived by a known transformation from) the number of bytes in the sensed data that have at least one non-conducting bitline. In another illustrative example, the metrics can include the failed bit count (CFBit), which reflects (i.e., is equal to or is derived by a known transformation from) the number of non-conducting bitlines in the sensed data. Certain calibration operations performed by the memory device may use a CFByte metric and/or a CFBit metric to iteratively determine a voltage threshold adjustment for reading the sensed data.

Upon performing a read strobe, the metrics characterizing the threshold voltage distributions (e.g., the failed byte count or the failed bit count) are returned by the memory devices to the memory sub-system controller or used by the local media controller in order to determine the voltage threshold adjustment values, which can then be utilized for performing the next read strobe. In some embodiments, the data is not transferred (e.g., over a memory interface) subsequent to the read strobe. Bandwidth for data transfer is thus maintained. After performing each read strobe, the controller can decode the sensed data. This sequence of calibration and read operations can be iteratively performed until either the read voltage threshold converges on a value (in which case no further action is needed) or a predefined maximum number of calibration operations have been performed. If the voltage threshold does not converge, the sequence may be started anew after a delay and/or with respect to a new set of memory cells.

Thus, embodiments of the present disclosure improve the accuracy and efficiency of voltage threshold calibration operations while maintaining bandwidth for servicing data transfer (e.g., via the memory interface). In various embodiments, the voltage threshold calibration can be performed by the media controller residing on the memory device or by the memory sub-system controller. Furthermore, the voltage threshold calibration performed in accordance with aspects of the present disclosure significantly improves the bit error rate, by tracking the voltage threshold shift caused by slow charge loss and/or temperature as well as compensating for the program and read disturb and/or physical defects of the storage media, as described in more detail herein below. Adjusted voltage thresholds can thus be applied when performing a read command based on the tracking of the voltage threshold shift, increasing the accuracy of the read operation.

While the examples described herein involve triple level cell (TLC) voltage distributions, in various other implementations, similar techniques can be implemented for memory pages storing other numbers of bits per cell.

FIG. 1 illustrates an example computing system 100 that includes a memory sub-system 110 in accordance with some implementations of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some implementations, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some implementations, each of the memory devices 130 can include one or more arrays of memory cells such as SLCs, MLCs, TLCs, QLCs, or any combination of such. In some implementations, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some implementations, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some implementations, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some implementations, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some implementations, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a memory access manager 134 configured to carry out memory access operations, e.g., in response to receiving memory access commands from memory interface 113. In some implementations, local media controller 135 includes at least a portion of memory access manager 134 and is configured to perform the functionality described herein. In some implementations, memory access manager 134 is implemented on memory device 130 using firmware, hardware components, or a combination of the above. In an illustrative example, memory access manager 134 receives, from a requestor, such as memory interface 113, a request to read a data page of the memory device 130. A read operation can include a series of read strobes, such that each strobe applied a certain voltage level to a chosen wordline of a memory device 130 in order to compare the estimated threshold voltages $V_T$ of a set of memory cells to one or more voltage thresholds corresponding to the expected positions of the voltage distributions of the memory cells.

In some implementations, the memory access manager 134 utilizes memory device-originated metrics characterizing voltage distributions for adjusting voltage threshold levels. Accordingly, the memory device 130 can, in response to a read strobe, return one or more metrics (e.g., metadata values) to the memory access manager 134. In an illustrative example, the memory device may, upon performing a read strobe, return the failed byte count (CFByte). The failed byte count reflects (i.e., is equal to or is derived by a known transformation from) the number of bytes in the sensed data that have at least one non-conducting bitline. In another illustrative example, the memory device may, upon performing a read strobe, return the failed bit count (CFBit). The failed bit count reflects (i.e., is equal to or is derived by a known transformation from) the number of non-conducting bitlines in the sensed data. In various illustrative examples, the memory device can inspect at least a part of a memory page (e.g., four or eight bitlines) when counting non-conducting bitlines.

The metrics received from the memory device in response to a read strobe can be used by the memory sub-system controller 115 or a local media controller 135 ("the controller") in order to adjust the applied voltage levels in order to compensate for the voltage distribution shift. Adjustments to the applied voltage levels can be accomplished through one or more iterative calibration operations, as described herein.

As noted herein above, in some implementations, the controller can utilize the memory device-originated metrics (e.g., metadata) characterizing voltage distributions for adjusting the voltage threshold level in a manner that would minimize the read operation latency while providing at least a specified accuracy of the read operation. The controller can utilize the metrics in one or more iterative voltage threshold calibration operations to determine a voltage threshold adjustment. Alternatively, the controller can utilize the memory device-originated metadata characterizing voltage distributions for adjusting the voltage threshold in a manner that would maximize the read operation accuracy while not exceeding a specified latency of the read operation.

In some implementations, the controller can utilize one or more returned metrics to index a data structure (e.g., a lookup table) mapping memory device-originated metrics (e.g., failed byte counts or failed bit counts) to the voltage threshold adjustment values. Alternatively, the controller can compute the voltage threshold adjustment value by applying a predefined mathematical transformation to the memory device-originated metrics (e.g., failed byte counts or failed bit counts). In some implementations, the controller can index the data structure to determine a first voltage threshold adjustment during a first calibration operation, and/or apply a predefined mathematical transformation to determine a second voltage threshold adjustment during a second calibration operation. The controller can then utilize the determined voltage threshold adjustment value for performing subsequent read operations.

In an illustrative example, the controller can perform voltage threshold calibration (i.e., adjusting the read level voltages) as part of a read command flow.

After performing each read strobe, the controller can decode the sensed data. This sequence of calibration and read operations can be iteratively performed until either the read voltage threshold converges on a final value (in which case no further action is needed) or a predefined maximum number of calibration operations have been performed. If the voltage threshold does not converge, the sequence may be started anew after a delay and/or with respect to a new set of memory cells. Similarly, if the voltage threshold does not converge, a notification of the failure to converge (e.g., a FAIL notification) may be sent to the controller.

Figure 2:
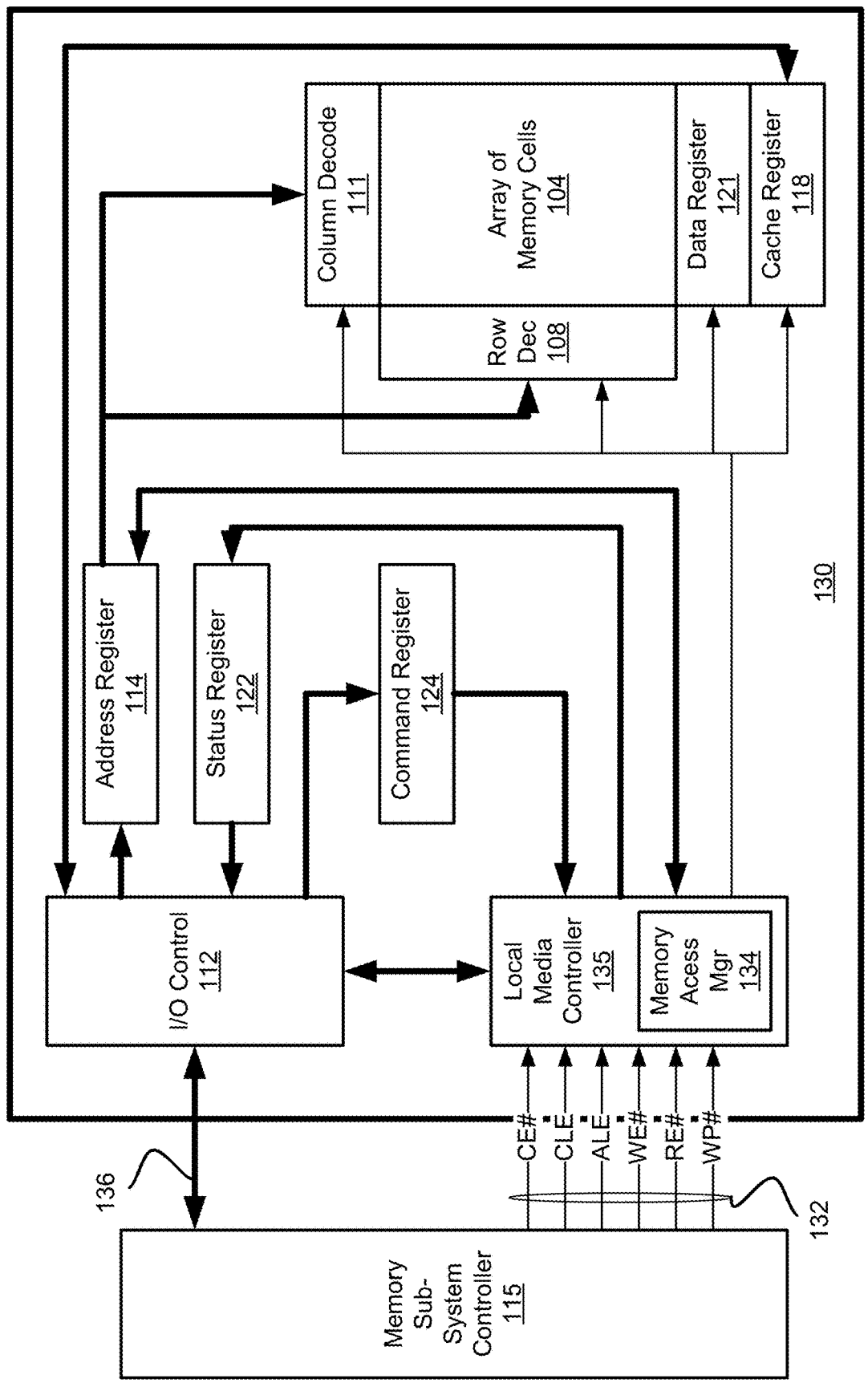
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line can be associated with more than one logical row of memory cells and a single data line can be associated with more than one logical column. Memory cells (not shown in FIG. 2) of at least a portion of array of memory cells 104 are capable of being programmed to one of at least two target data states.

Row decode circuitry 108 and column decode circuitry 111 are provided to decode address signals. Address signals are received and decoded to access the array of memory cells 204. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 108 and column decode circuitry 111 to control the row decode circuitry 108 and column decode circuitry 111 in response to the addresses. In one embodiment, local media controller 135 includes memory access manager 134, which can implement the memory programming operations with respect to memory device 130, as described herein.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a programming operation (e.g., a write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form a portion of) a page buffer of the memory device 130. A page buffer can further include sensing devices (not shown in FIG. 2) to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands can be received over input/output (I/O) pins [7:0] of I/O bus 136 at I/O control circuitry 112 and can then be written into command register 124. The addresses can be received over input/output (I/O) pins [7:0] of I/O bus 136 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 cannot necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) can be used in the various embodiments.

One or more memory devices of the memory sub-system 100 can be represented, e.g., by NAND memory devices that utilize transistor arrays built on semiconductor chips. As illustrated schematically in FIG. 3A, a memory cell of a memory device can be a transistor, such as metal-oxide-semiconductor field effect transistor (MOSFET), having a source (S) electrode and a drain (D) electrode to pass electric current there through. The source and drain electrodes can be connected to a conductive bitline (BL), which can be shared by multiple memory cells. A memory device can include an array or memory cells that are connected to a plurality of wordlines (WL) and a plurality of bitlines (BL), as schematically illustrated by FIG. 4. A memory device can further include circuitry for selectively coupling WLs and BLs to voltage sources providing control gate and source-drain signals, which is omitted from FIG. 4 for clarity and conciseness.

Figure 3B:
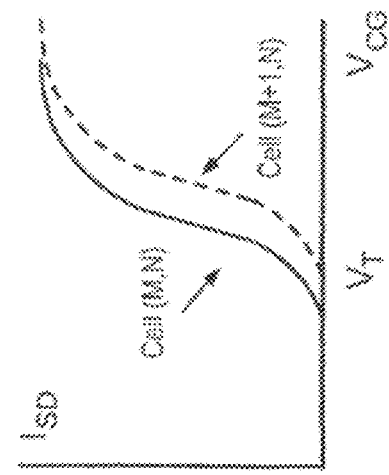
FIG. 3B schematically illustrates schematically dependence of the source-drain current on the control gate voltage for two memory cells.

Referring again to FIG. 3A, memory cells 302 and 304 can be connected to the same bitline N and two different conductive wordlines, M and M+1, respectively. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG}<V_T$, the source-drain electric current can be low, but can increase substantially once the control gate voltage has exceeded the threshold voltage, $V_{CG}>V_T$. Transistors of the same memory device can be characterized by a distribution of their threshold voltages, $P(V_T)=dW/dV_T$, so that $dW=P(V_T)dV_T$ represents the probability that any given transistor has its threshold voltage within the interval $[V_T,V_T+dV_T]$. For example, FIG. 3B illustrates schematically dependence of the source-drain current $I_{SD}$ on the control gate voltage for two memory cells, e.g. memory cell 302 (solid line) and memory cell 304 (dashed line), having different threshold control gate voltages.

Figure 3A:
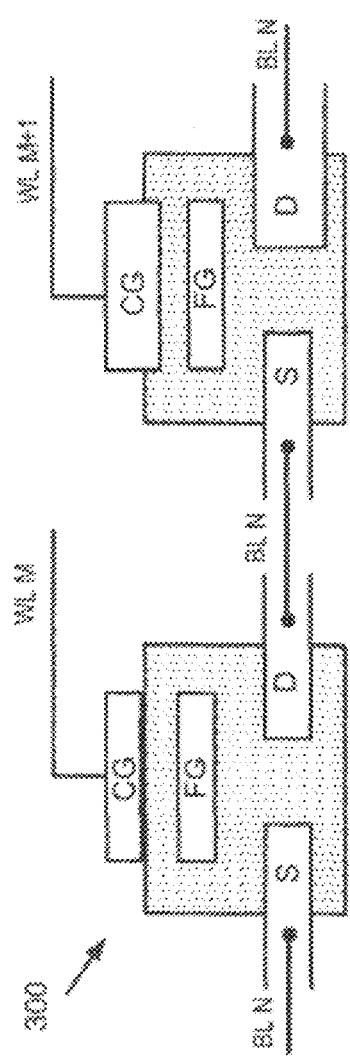
FIG. 3A schematically illustrates a set of memory cells as arranged in a memory device.
Figure 4:
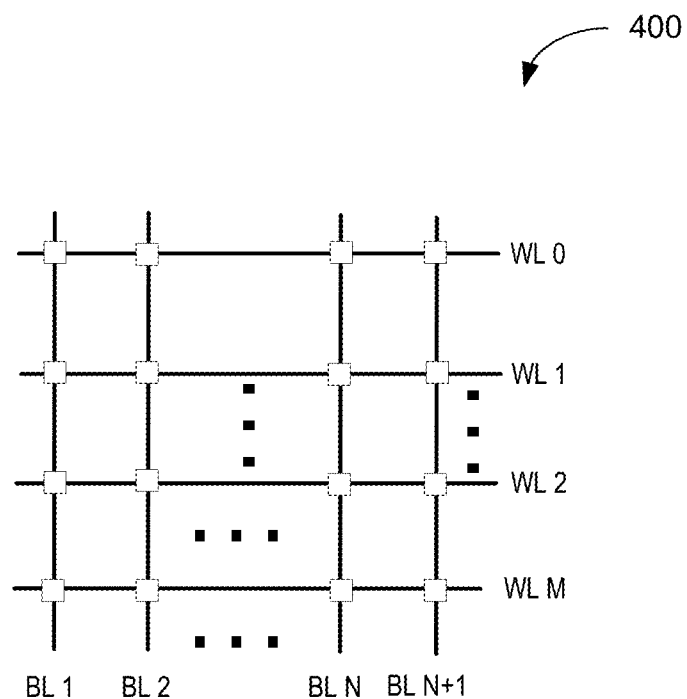
FIG. 4 schematically illustrates an example memory array.

To make a memory cell non-volatile, the cell can be further equipped with a conducting island—a charge storage node—that can be electrically isolated from the control gate, the source electrode, and the drain electrode by insulating layers (depicted in FIG. 3A as the dotted region). In response to an appropriately chosen positive (in relation to the source potential) control gate voltage $V_{CG}$, the charge storage node can receive an electric charge Q, which can be permanently stored thereon even after the power to the memory cell—and, consequently, the source-drain current—is ceased. The charge Q can affect the distribution of threshold voltages $P(V_T,Q)$. Generally, the presence of the electric charge Q shifts the distribution of threshold voltages towards higher voltages, compared with the distribution $P(V_T)$ for an uncharged charge storage node. This happens because a stronger positive control gate voltage $V_{CG}$ can be needed to overcome a negative potential of the charge storage node charge Q. If any charge of a sequence $Q_k$ of charges with $1 \leq k \leq 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N-1$ valley margins.

Figure 3C:
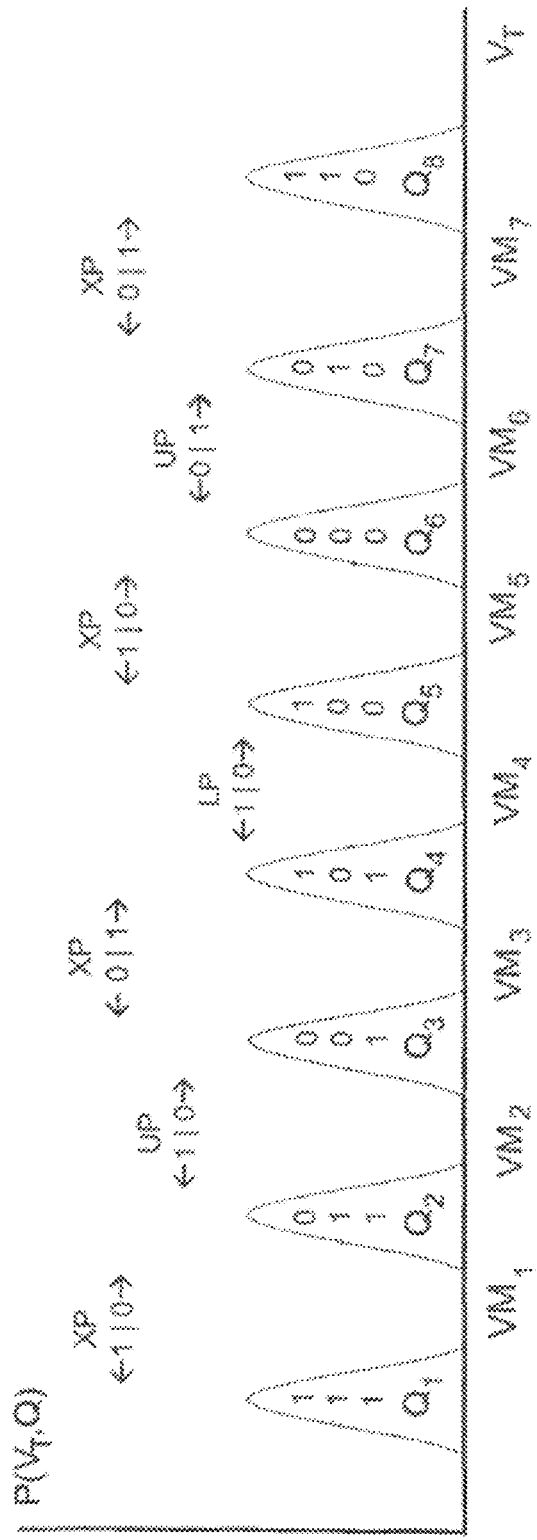
FIG. 3C schematically illustrates an example distribution of threshold control gate voltages for a set of memory cells.

FIG. 3C illustrates schematically a distribution of threshold control gate voltages for a set of memory cells capable of storing three bits of data by programming the memory cell into at least eight charge states that differ by the amount of charge on the cell's charge storage node. FIG. 3C shows distributions of threshold voltages $P(V_T, Q_k)$ for $2^N=8$ different charge states of a tri-level cell (TLC) separated with $2^3-1=7$ valley margins $VM_k$. Accordingly, a memory cell programmed into a charge state k-th (i.e., having the charge $Q_k$ deposited on its charge storage node) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

Memory devices can be classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In general, the operations described herein can be applied to memory devices having N-bit memory cells, where N>1.

For example, a TLC can be capable of being in one of eight charging states $Q_k$ (where the first state is an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 215.

As noted herein above, the memory controller 215 can program a state of the memory cell and then read can read this state by comparing a read threshold voltage $V_T$ of the memory cell against one or more read level thresholds. The read operation can be performed after a memory cell is placed in one of its charged states by a previous programming operation, which can include one or more programming passes. Each programming pass would apply appropriate programming voltages to a given wordline in order place appropriate charges on the charge storage nodes of the memory cells that are connected to the wordline.

A programming operation involves a sequence of programming voltage pulses that are applied to a selected (target) wordline (i.e., the wordline that is electrically coupled to the target memory cells). Referring again to FIG. 3A, the source (S) and drain (D) electrodes of a memory cell can be connected to a conductive bitline shared by multiple memory cells. A programming operation would apply a sequence of programming voltage pulses to the control gate (CG) via a corresponding wordline (WL). Each programming voltage pulse would induce an electric field that would pull the electrons onto the charge storage node. After each programming pulse is applied to the selected wordline, a verify operation can be performed by reading the memory cell in order to determine whether the threshold voltage $V_T$ of the memory cell has reached a desired value (voltage verify level). If the threshold voltage $V_T$ of the memory cell has reached the verify voltage associated with the desired state, the bitline to which the memory cell is connected can be biased at the program inhibit voltage, thus inhibiting the memory cells that are coupled to the bitline from being further programmed, i.e., to prevent the threshold voltage $V_T$ of the memory cells from shifting further upward in response to subsequent programming pulses applied to the selected wordline.

Figure 5A:
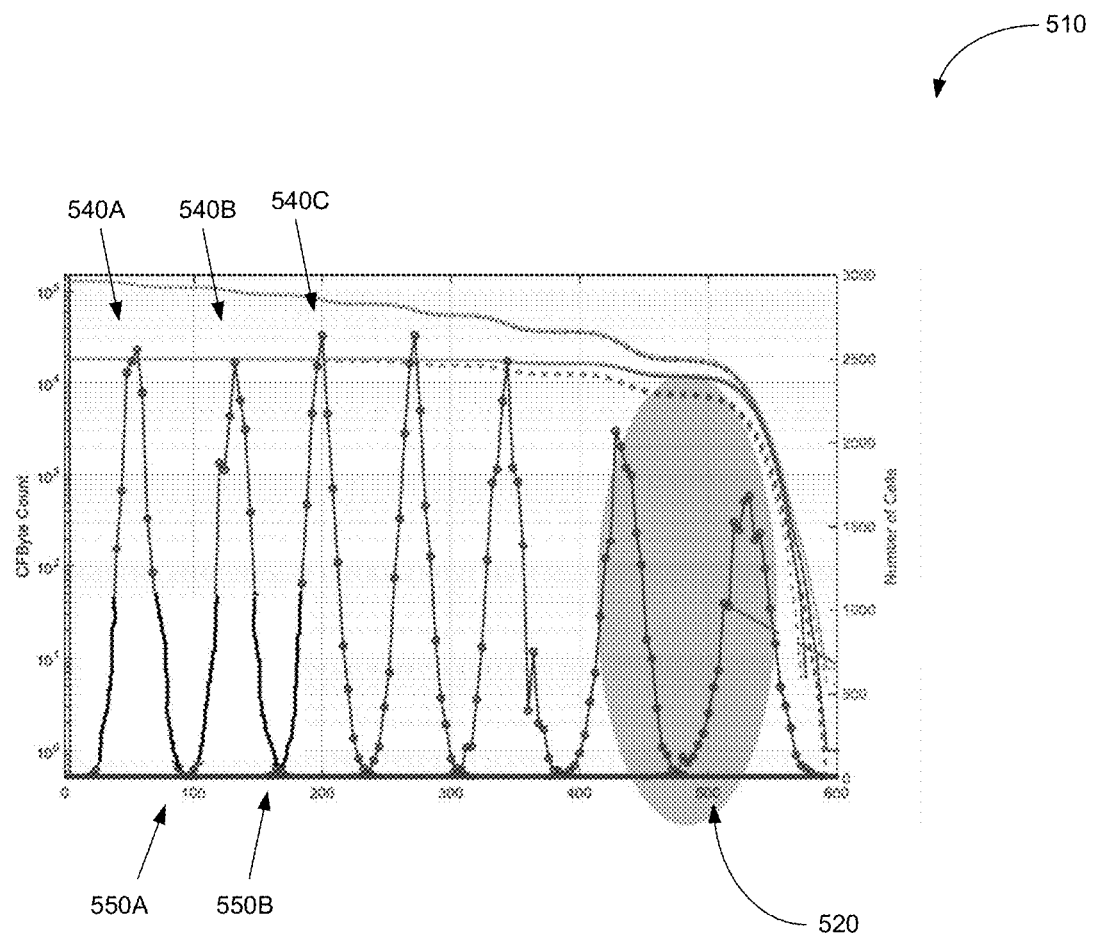
FIGS. 5A-5B schematically illustrates example threshold voltage distributions and corresponding device-originated metrics in a triple-level cell (TLC) memory page, in accordance with aspects of the present disclosure.
Figure 5B:
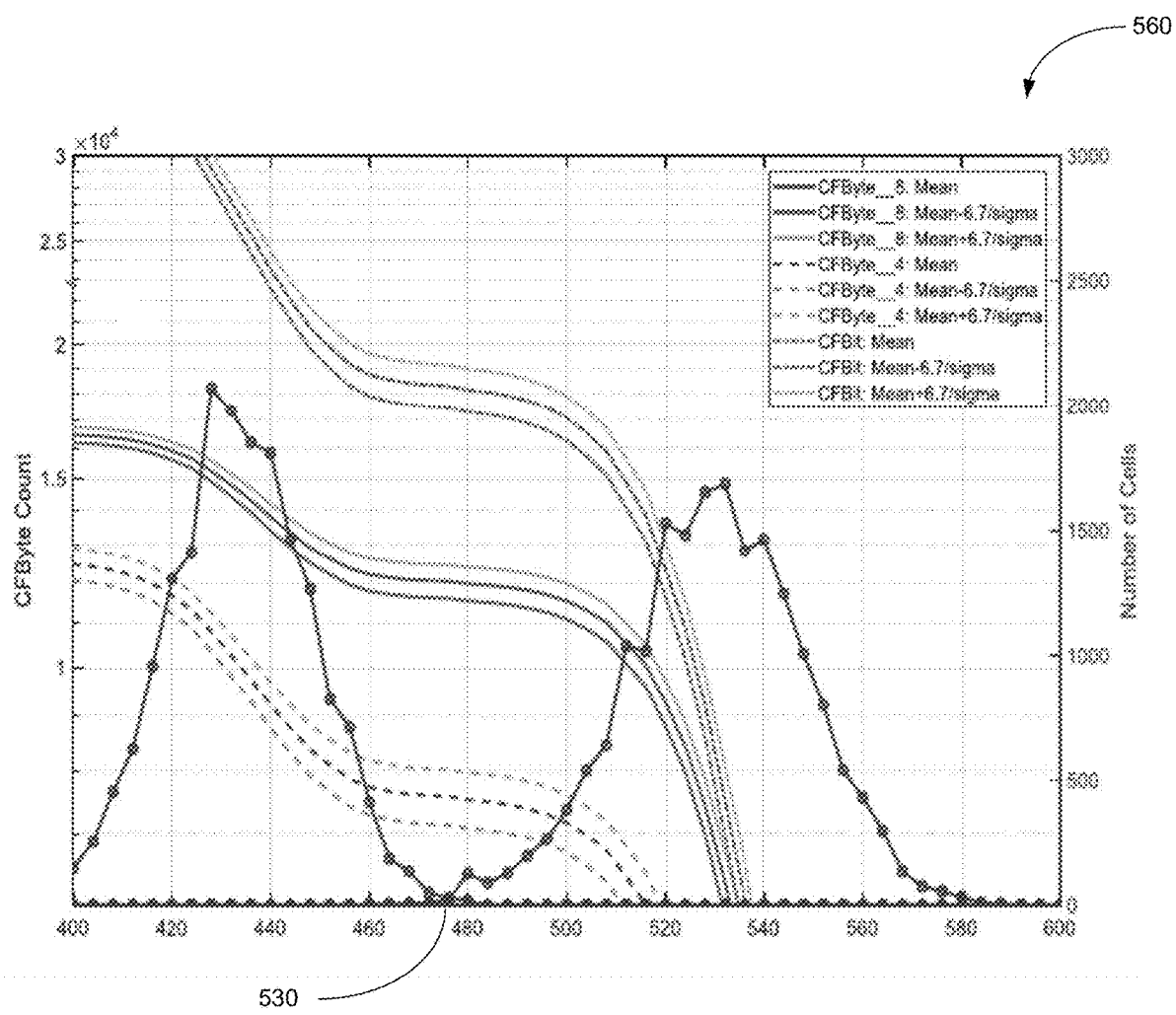

As noted herein above, the systems and methods of the present disclosure utilize certain memory device-originated metrics (e.g., metadata, failed bit counts and/or failed byte counts) for adjusting the voltage threshold read levels. FIGS. 5A-5B schematically illustrate threshold voltage distributions of a set of memory cells and corresponding metrics (the failed byte count (CFByte) and the failed bit count (CFBit)).

Each memory cell can be programmed into one or several (e.g., eight) charge states that differ by the amount of charge stored by the cell. FIG. 5A shows example distributions 540A-540C of threshold voltages $P(V_T, Q_k)$ for different TLC charge states, which are separated by respective valley margins 550A-550B. The charge state $Q_k$ of a given memory cell can be determined by a read operation by detecting that a control gate voltage $V_{CG}$ within the valley margin $VM_k$ is sufficient to open the cell to the source-drain current whereas a control gate voltage within the preceding valley margin $VM_{k-1}$ is not. Accordingly, for a given read operation, the memory sub-system controller 115 can sequentially perform two or more read strobes at the read voltage levels that correspond to the presumed positions of one or more valley margins 550.

As illustrated by FIGS. 5A-5B, the failed byte count (reflecting the number of bytes in the sensed data that have at least one non-conducting bitline) and the failed bit count (reflecting the number of non-conducting bitlines in the sensed data) have respective defined relationships with threshold voltage distributions. In an illustrative example of FIG. 5A, plot 510 schematically illustrates the dependency between the failed byte count (CFByte), the failed bit count (CFBit) and threshold voltage distributions of a set of memory cells, while plot 560 of FIG. 5B shows the detailed view of the area of interest 520 of plot 510. As can be seen from the plots 510 and 560, certain read level voltages applied to the set of memory cells would result in corresponding the failed byte count (CFByte) and/or the failed bit count (CFBit) values. Thus, the failed byte count and/or failed bit count measured at a certain read voltage level would correspond to certain numbers of memory cells that are found, within the threshold voltage distribution, below and above the read level.

Accordingly, in response to a read strobe issued by the memory sub-system controller 115, the memory device 130 can return the failed bit count and/or failed byte count together with the sensed data. The controller can evaluate a chosen data state metric on the sensed data in order to determine a threshold voltage adjustment. The controller can translate the received failed byte count and/or failed bit count values to the voltage threshold adjustments (e.g., via one or more iterative calibration operations). This sequence of calibration and read operations can be iteratively performed until either the read voltage threshold converges on a value (in which case no further action is needed) or a predefined maximum number of calibration operations have been performed. If the voltage threshold does not converge, the sequence may be started anew after a delay and/or with respect to a new set of memory cells. The adjusted voltage threshold can then be utilized for performing subsequent read operations with respect to the wordline to which the initial read strobe has been applied and/or to one or more neighboring wordlines of that wordline.

In some implementations, the controller can utilize one or more returned metrics to index a data structure (e.g., a lookup table) mapping memory device-originated metrics (e.g., failed byte counts or failed bit counts) to the voltage threshold adjustment values. The data structure can be device type-specific, and can be pre-populated by analyzing memory device performance over at least a predefined number of program-erase cycles.

Alternatively, the controller can compute the voltage threshold adjustment value by applying a predefined mathematical transformation to the memory device-originated metrics (e.g., failed byte counts or failed bit counts). In an illustrative example, the predefined transformation can be represented by a quadratic approximation on the differences of pairs of failed bit counts measured on consecutive strobes.

In some embodiments, the controller can determine a first voltage threshold adjustment value by utilizing one or more returned metrics to index a data structure (e.g., a lookup table) mapping memory device-originated metrics to the voltage threshold adjustment values in a first calibration operation. The controller may next compute a second voltage threshold adjustment value by applying a first predefined mathematical transformation to the memory device-originated metrics in a second calibration operation. The controller may use the first voltage threshold adjustment value and/or the second voltage threshold adjustment value for reading the data stored in the memory cells. In some examples, the controller uses an aggregation of the first voltage threshold adjustment value and/or the second voltage threshold adjustment value for reading the data.

Figure 6:
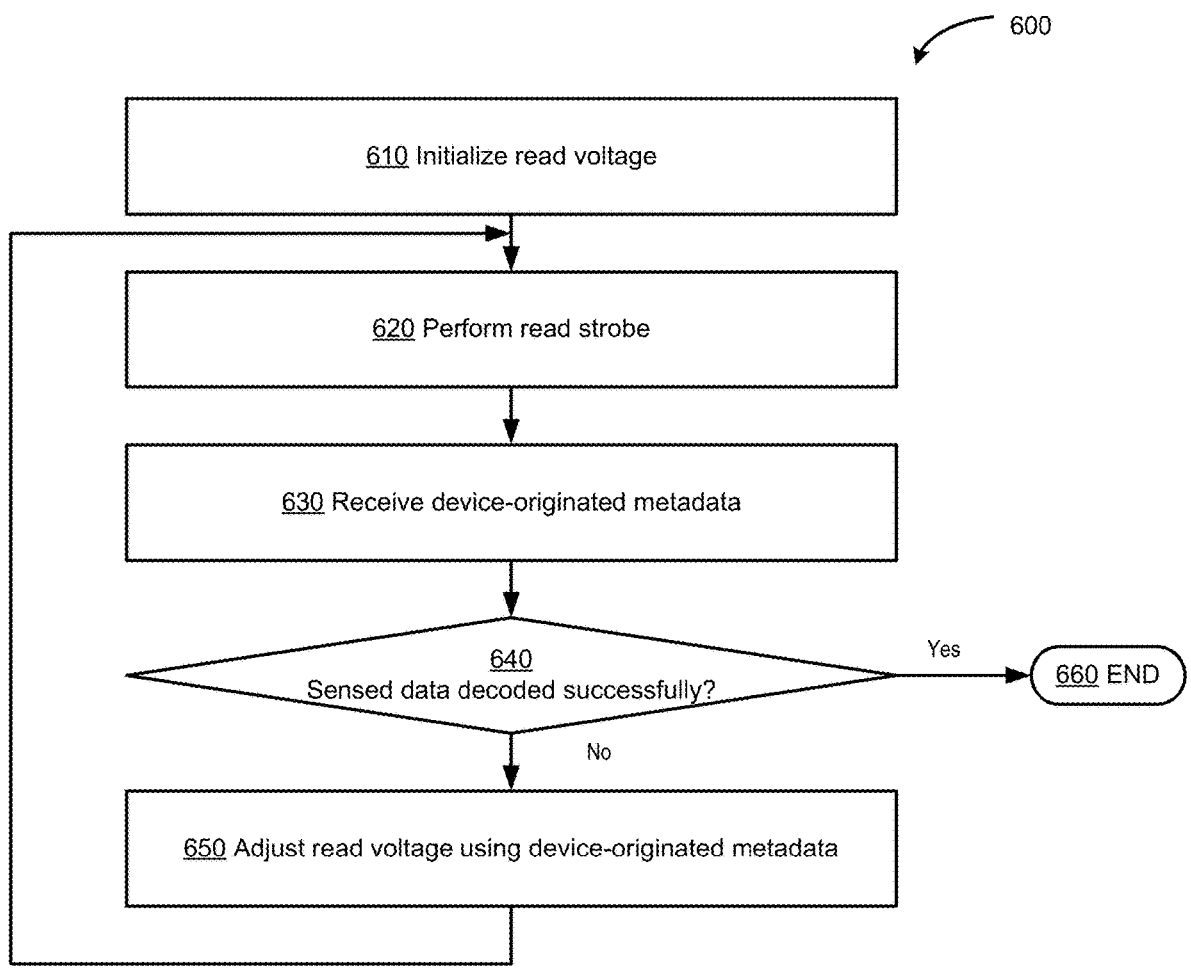
FIG. 6 is a flow diagram of an example method of calibrating read level voltage in memory devices, in accordance with embodiments of the present disclosure.

FIG. 6 is a flow diagram of an example method 600 of calibrating read level voltage (e.g., voltage threshold levels) in memory devices, in accordance with embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 600 is performed by the memory sub-system controller 115 and/or the local media controller 135 of FIG. 1.

In some implementations, the method 600 can be performed within a read command, in order to calibrate prior to final sensing. In some implementations, the method 600 can be performed by the media controller, and voltage threshold adjustment can be performed prior to final sensing of data. Thus, a single read command can involve receiving the required metadata, applying the read voltage adjustment values, and sensing the memory array to provide sensed data to be transferred via the memory interface.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 610, the controller implementing the method initializes the read voltage to be applied to a specified wordline of a memory device. The default read level voltage may be device type-specific and may be stored in the memory of the controller.

At operation 620, the controller causes a read strobe to be performed, which involves applying the chosen or adjusted read level voltage (e.g., threshold voltage) to a specified wordline of the memory device.

At operation 630, the controller receives the memory device-originated metadata reflecting the conductive state of one or more bitlines. The memory device-originated metadata can include, e.g., the failed byte count and/or failed bit count, as described in more detail herein.

Responsive to determining, at operation 640, that the sensed data is successfully decoded (e.g., based on a value of a chosen data state metric), the method terminates (operation 660).

Otherwise (i.e., responsive to failing, at operation 640, to successfully decode the sensed data), the controller, at operation 650, use the received memory device-originated metrics for determining read voltage adjustment values. In some implementations, the controller can utilize one or more returned metrics to index a data structure (e.g., a lookup table) mapping memory device-originated metrics (e.g., failed byte counts or failed bit counts) to the read voltage adjustment values. Alternatively, the controller can compute the read voltage adjustment value by applying a predefined mathematical transformation to the memory device-originated metrics (e.g., failed byte counts or failed bit counts).

Upon completing operation 650, the method loops back to operation 620.

Figure 7:
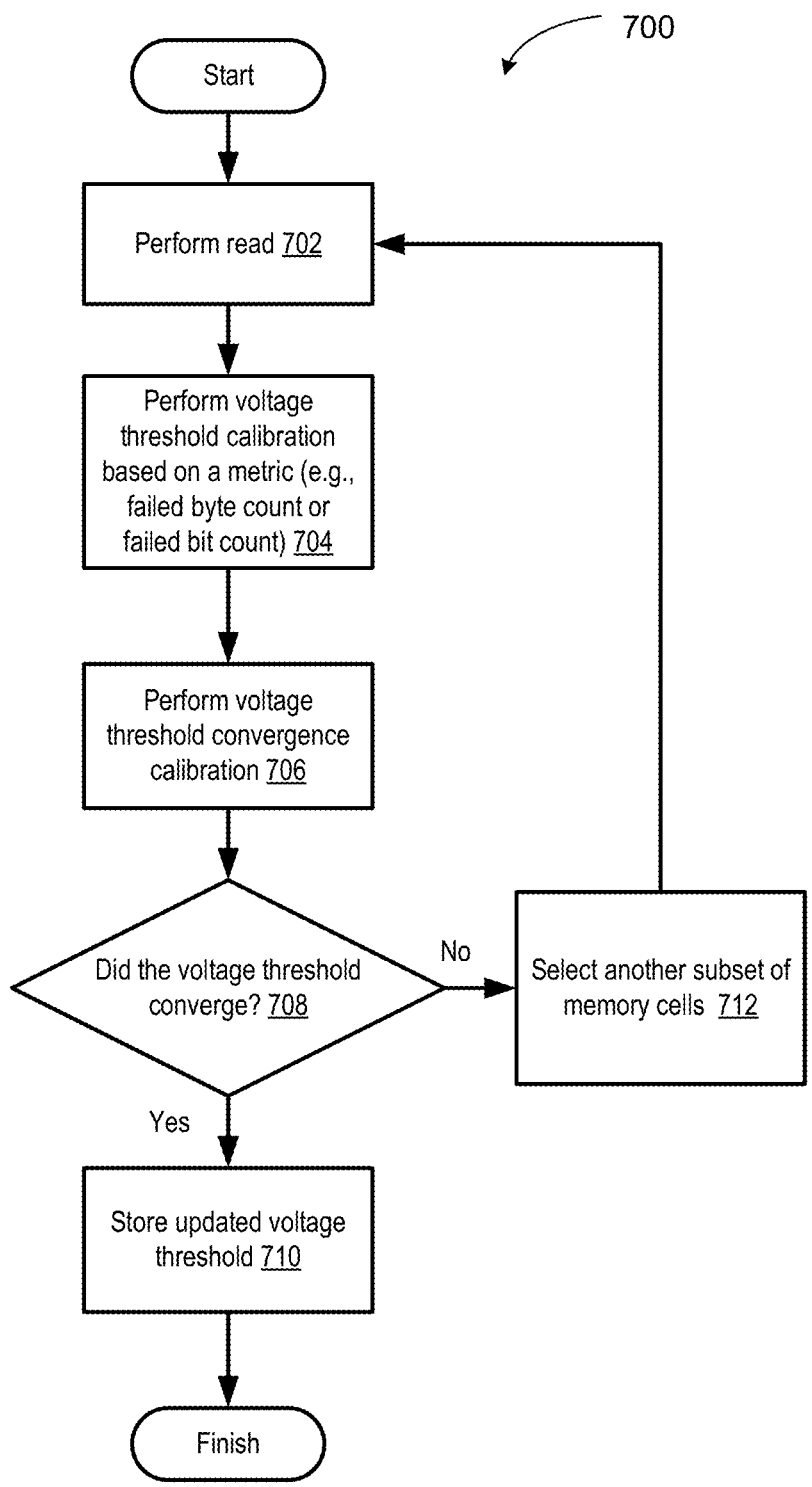
FIG. 7 is a flow diagram of an example method of calibrating read voltage thresholds in memory devices, in accordance with embodiments of the present disclosure.

FIG. 7 is a flow diagram of an example method 700 of calibrating read voltage thresholds in memory devices, in accordance with embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 700 is performed by the memory sub-system controller 115 and/or by the local media controller 135 of FIG. 1.

In some implementations, the method 700 can be performed in anticipation of a read command, in order to calibrate prior to the read command. In some implementations, the method 700 can be performed by the media controller, and voltage threshold adjustment can be performed to track voltage loss (e.g., of the memory cells) over time. In some embodiments, responsive to one or more read strobes performed as part of method 700, the memory device returns metric values (e.g., CFBit and/or CFByte) and the data is sensed into one or more page buffers. However, in some implementations, the controller does not release the data from the page buffers over the memory interface to reduce the memory interface bandwidth usage.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 702, the controller implementing the method 700 causes a read of data stored by a set of memory cells (e.g., one or more pages, addressable by a specified wordline, etc.) to be performed (e.g., subsequent to an initial read). The read may be performed in anticipation of a read command and/or periodically during the storage of the data. The read at operation 702 may utilize a previously stored and/or determined voltage threshold. In some embodiments, no data is transferred during the read (e.g., the sensed data is not transferred via a memory interface). In some embodiments, only a single logical page of the memory cells is read. For example, in some implementations, only an extra logical page or a top logical page is read. In some embodiments, the read is performed at operation 702 subsequent to detecting that data read from a memory storage location fails a quality criterion (e.g., includes more than a threshold amount of errors). In some embodiments, the read is performed at operation 702 subsequent to detecting voltage loss in memory cells at the memory storage location. The read may be performed with respect to a subset of a set of memory cells of a memory device. In some examples, a select number of memory cells are read (e.g., the subset of memory cells). The memory cells that are read may be selected from a larger group of memory cells (e.g., a set of memory cells) of the memory device. In some embodiments, the characteristics of the subset of read memory cells (e.g., CFBit, CFByte, etc.) may be indicative of the characteristics of the set of memory cells to which the subset of memory cells belongs. In some implementations, the set of memory cells may belong to a "block family." "Block family" herein may refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. In some embodiments, the read operation performed at operation 702 may be performed with respect to a subset of memory cells of the block family.

At operation 704, the controller performs a voltage threshold calibration (e.g., the first calibration operation) based on the first value of the chosen metric (e.g., reflecting a failed byte count, CFByte, or a failed bit count, CFBit). The voltage threshold calibration based on the failed byte count or the failed bit count may return a first voltage threshold adjustment value as described herein. The second read operation using the first voltage threshold adjustment value may be performed as part of operation 704. More details regarding the voltage threshold calibration based on the failed byte count or the failed bit count may be described with reference to FIG. 8.

At operation 706, the controller performs a voltage threshold convergence calibration (e.g., the second calibration operation). The voltage threshold convergence calibration may be based upon the second value of the chosen metric (e.g., reflecting the failed byte count, CFByte or the failed bit count, CFBit). For example, the voltage threshold convergence calibration can adjust the voltage threshold (e.g., up or down) so that the updated voltage threshold results in the metric more closely matching the target value of the metric. In some examples, responsive to the second value of the metric being lower than the target value, the voltage threshold can be adjusted downwards by the calibration operation. Similarly, responsive to the second value of the metric being higher than the target value, the voltage threshold can be adjusted upwards in the calibration operation. The voltage threshold convergence calibration may output the second voltage threshold adjustment value that can be applied to the voltage threshold as described herein. In some embodiments, the voltage threshold convergence calibration may be iterative. For example, the voltage threshold convergence calibration may be repeatedly performed until the second voltage threshold adjustment value is within a predetermined range (e.g., within a predetermined tolerance of a target voltage threshold, satisfies a threshold criterion, etc.) and/or converges on a specific voltage threshold. In some embodiments, the voltage threshold convergence calibration may be repeated a predetermined number of times. For example, the voltage threshold convergence calibration may include a set number of iterations (e.g., four iterations, five iterations, etc.). More details regarding the voltage threshold convergence calibration may be described with reference to FIG. 8B and FIG. 9.

At operation 708, the controller determines whether the voltage threshold has converged, responsive to performing the voltage threshold convergence calibration at operation 706. If the voltage threshold has converged, the method proceeds to operation 710, where the voltage threshold is updated (e.g., based on the first and/or second voltage threshold adjustment values) and stored. The stored value of the voltage threshold can be used for servicing a subsequent read command performed with respect to the memory cells. In some embodiments, the updated voltage threshold may be used for reading the memory cells of the block family described herein above with respect to operation 702. If the voltage threshold has not converged, the method proceeds to operation 712.

At operation 712, the controller selects another subset of memory cells to read. The controller may select another subset of memory cells belonging to the same block family. In some embodiments, the failure of the voltage threshold to converge is due to an error inherent in the previously-selected memory cells. A new set of memory cells (e.g., belonging to the same memory block family) can be analyzed to perform the calibration operations described herein. After selecting another subset of memory cells, the method may loop back to operation 702. In some embodiments, the same subset of memory cells are analyzed again. In such embodiments, a predetermined duration of time may be allowed to elapse before attempting to analyze the memory cells a second time.

Figure 8A:
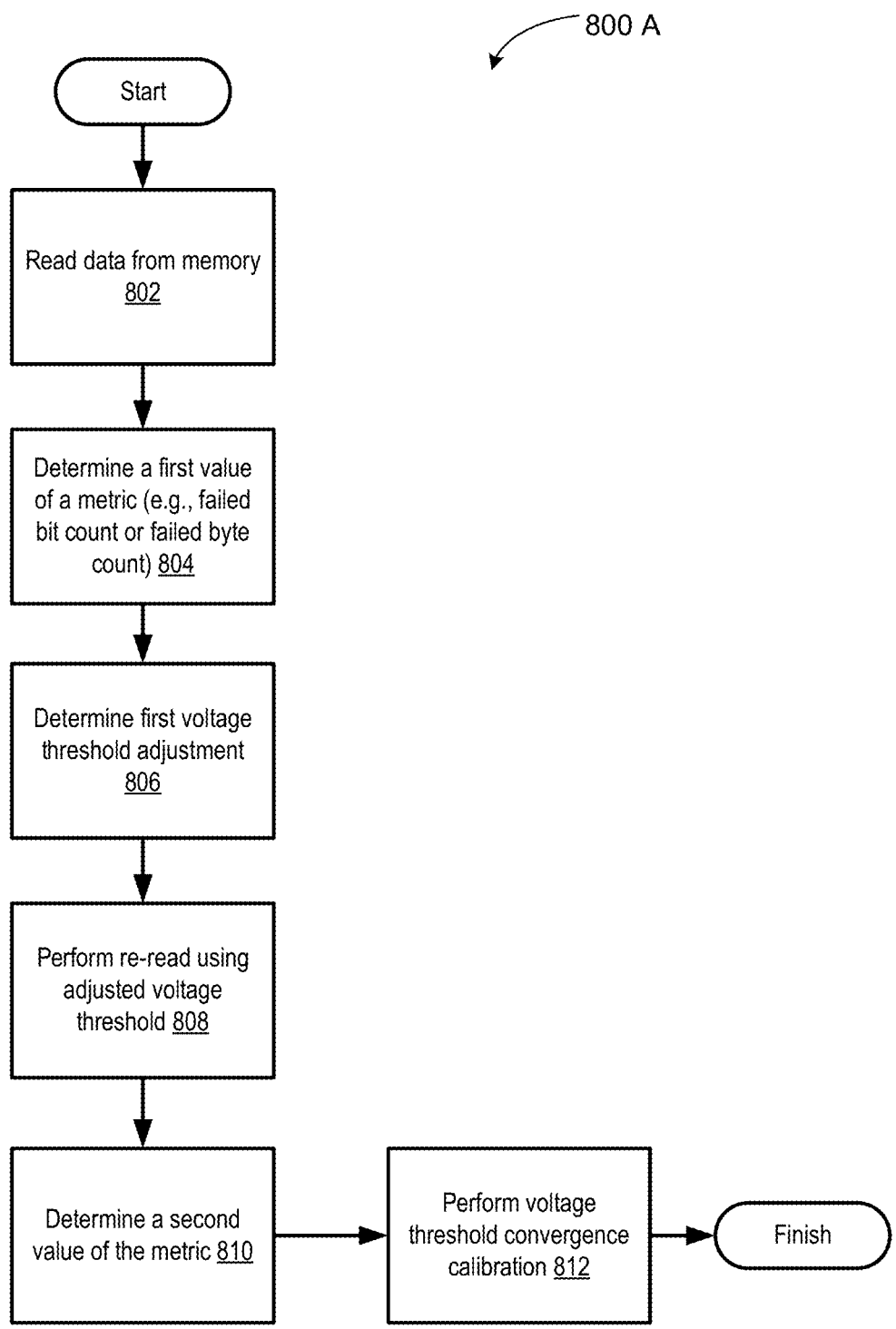
FIGS. 8A-8B are flow diagrams of example calibration operations for calibrating read voltage thresholds in memory devices, in accordance with embodiments of the present disclosure.

FIG. 8A is a flow diagram of an example method 800A of an example calibration operation for calibrating read voltage thresholds in memory devices, in accordance with embodiments of the present disclosure. The method 800A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 800 is performed by the memory sub-system controller 115 and/or the local media controller 135 of FIG. 1.

In some implementations, the method 800A can be performed in anticipation of a read command, in order to calibrate prior to the read command. In some implementations, method 800A is associated with one or more operations of method 700 (e.g., operation 702, operation 704, operation 706, etc.). In some implementations, the method 800A can be performed by the media controller, and voltage threshold adjustment can be performed to track voltage loss (e.g., of the memory cells) over time. In some embodiments, data is not transferred during the performance of method 800A.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 802, the controller implementing the method 800 performs a read operation to read data from a memory (e.g., a memory storage, a memory array, one or more memory cells, a memory block, etc.). The read may be performed in anticipation of a read command and/or periodically during the storage of the data. In some embodiments, no data is transferred during the read. For example, the read operation may be a read strobe without any data transfer. In some embodiments, the read is performed at operation 802 subsequent to detecting that data read from a memory storage location fails a quality criterion (e.g., includes more than a threshold amount of errors). In some embodiments, the read is performed at operation 802 subsequent to detecting voltage loss in memory cells at the memory storage location. Operation 802 may correspond to operation 702 of FIG. 7.

At operation 804, the controller determines a first value of a metric. In some embodiments, the metric may be a failed byte count (e.g., CFByte) or a failed bit count (e.g., CFBit) of the read data. In some embodiments, the conductive state of one or more bitlines connected to the memory cells read at operation 802 is reflected by the failed byte count or by the failed bit count.

Figure 11A:
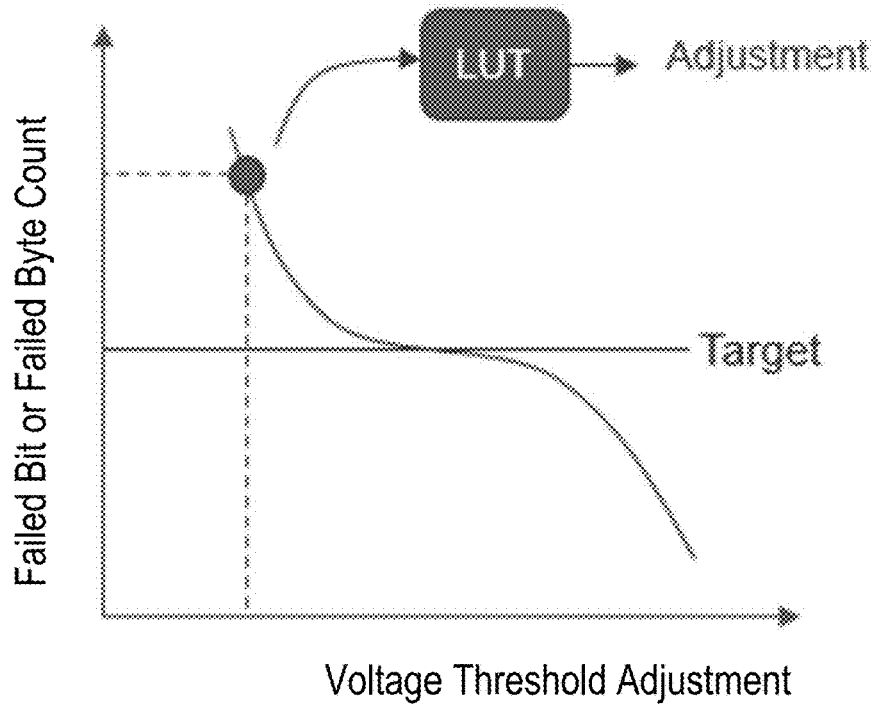
FIGS. 11A-G are diagrams illustrating methods of calibrating read voltage thresholds in memory devices, in accordance with embodiments of the present disclosure.

At operation 806, the controller determines a first voltage threshold adjustment. The controller may determine a first voltage threshold adjustment value via a calibration operation (e.g., the first calibration operation) to calibrate the voltage threshold. The voltage threshold calibration may be based on the value of the metric (e.g., CFByte or CFBit) determined at operation 804. Referring to FIG. 11A, a diagram illustrating a method of calibrating read level voltage in memory devices is shown, in accordance with embodiments of the present disclosure. FIG. 11A may show a mapping of a metric (e.g., failed bit or failed byte count) to voltage threshold adjustment. In some embodiments, the controller determines a voltage threshold adjustment value (e.g., a first voltage threshold adjustment value) from a data structure (e.g., a lookup table (LUT)) mapping values of the metric to voltage threshold adjustments. In some examples, a lookup table stores piecewise linear functions that map values of the metric to voltage threshold adjustments. In such examples, linear interpolation may be performed to determine a voltage threshold adjustment based on the value of the metric and the function stored in the lookup table. In some embodiments, the controller searches the data structure for an entry mapping the value of the metric to a corresponding voltage threshold adjustment value. The voltage threshold (e.g., for reading data stored in the memory cells) may be adjusted based on the voltage threshold adjustment value.

At operation 808, the controller performs a re-read operation using the adjusted voltage threshold to re-read the data from the memory. At operation 810, the controller determines a second value of the metric. In some embodiments, the second value of the metric is different from the first value of the metric responsive to the re-read operation using the adjusted voltage threshold. In some embodiments, the second value of the metric may be closer to a target value of the metric than the first value of the metric. In some embodiments, the target value of the metric may correspond to a target failed bit count (e.g., CFBit) or a target failed byte count (e.g., CFByte).

At operation 812, the controller performs a voltage threshold convergence calibration. More details regarding the read voltage convergence calibration may be discussed herein below with reference to FIG. 9. In some embodiments, the read voltage convergence calibration may be performed based on the second value of the metric determined at operation 810. After performing the read voltage convergence calibration, the method may be finished.

Figure 8B:
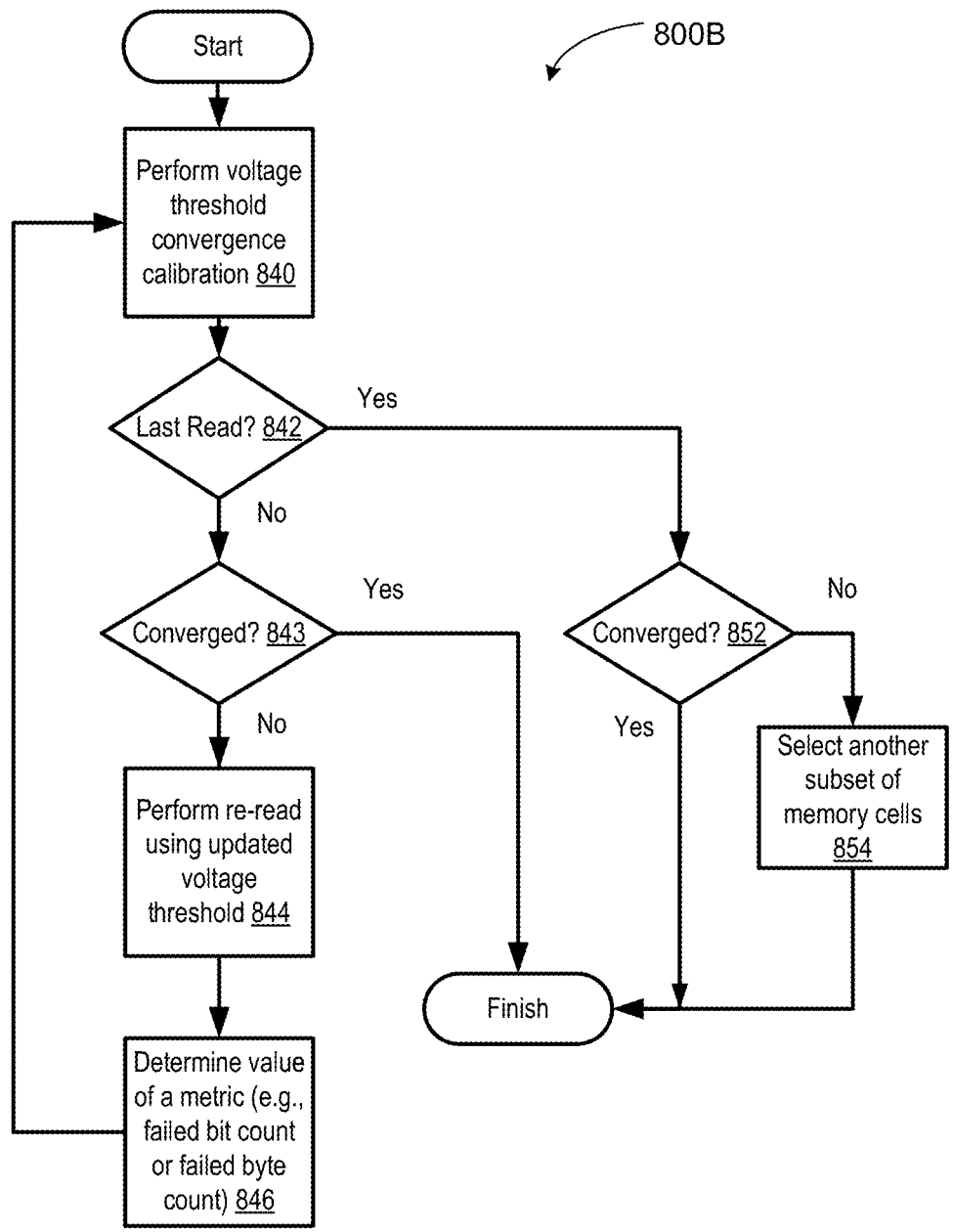

FIG. 8B is a flow diagram of an example method 800B of an example calibration operation for calibrating voltage thresholds in memory devices, in accordance with embodiments of the present disclosure. The method 800B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 800B is performed by the memory sub-system controller 115 and/or the local media controller 135 of FIG. 1.

In some implementations, the method 800B can be performed in anticipation of a read command, in order to calibrate prior to the read command. In some implementations, method 800B is associated with one or more operations of method 700 (e.g., operation 706, operation 708, operation 712, etc.). In some implementations, the method 800B can be performed by the media controller, and read threshold adjustment can be performed to track voltage loss (e.g., of the memory cells) over time. In some embodiments, the method 800B is performed in association with method 800A of FIG. 8A.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 840, the controller implementing the method 800B performs a voltage threshold convergence calibration. In some embodiments, operation 840 may correspond to operation 812 of FIG. 8A and/or operation 706 of FIG. 7. In some embodiments, a predetermined mathematical transform may be applied to a value of a metric (e.g., the failed bit count or failed byte count determined at operation 810 of FIG. 8A) to determine a voltage threshold adjustment value (e.g., a second voltage threshold adjustment value). In some embodiments, a data structure (e.g., a look-up table) mapping values of the metric to voltage threshold adjustment values is indexed based on the value of the metric to determine the voltage threshold adjustment value. The voltage threshold adjustment value may be applied to the current voltage threshold based on a target value of the metric (e.g., based on a relationship between the voltage threshold adjustment value, the current voltage threshold, and/or the value of the metric).

The voltage threshold convergence calibration may be performed to determine one or more local minima of a differentiated metric (e.g., failed bit count or failed byte count). For example, the voltage threshold adjustment value determined at operation 840 may correspond to a local minima of the differential of the metric relative to the voltage threshold. In some examples, linear interpolation is performed to determine a voltage threshold adjustment value (e.g., the second voltage threshold adjustment value) based on values of the metric determined at earlier calibration operations (e.g., the first calibration operation performed at operation 806 of FIG. 8A). In some embodiments, multiple values of the metric determined through multiple iterations of the voltage threshold calibration operation based on the metric are used to determine one or more local minima of the metric. The local minima of the metric may correspond to the voltage threshold adjustment value (e.g., the second voltage threshold adjustment value). In some embodiments, the local minima of the metric may correspond to a convergence of the voltage threshold (e.g., an optimized voltage threshold). The voltage threshold adjustment value (e.g., the second voltage threshold adjustment value) may be determined based on the local minima of the metric. In some examples, the voltage threshold is adjusted based on the difference of the local minima of the metric and the predetermined target of the metric. More details regarding the voltage threshold convergence calibration may be described herein below with respect to FIG. 9.

At operation 842, the controller determines whether a predetermined maximum number of reads have been performed. The predetermined maximum number of reads may be set in firmware. In some examples, the maximum number of reads may be four reads, five reads, six reads, seven reads, or eight reads, etc. If the predetermined maximum number of reads have been performed, the method proceeds to operation 852. If the predetermined maximum number of reads have not been performed, the method proceeds to operation 844.

At operation 843, the controller determines whether the voltage threshold has converged on a value. In some embodiments, the voltage threshold convergence calibration may adjust the voltage threshold toward a convergence value. The adjusted (e.g., updated) voltage threshold may converge on a value based on one or more iterations of the voltage threshold convergence calibration at operation 840. If the voltage threshold has converged, the method 800B may be finished. If the voltage threshold has not converged, the method may proceed to operation 844.

At operation 844, the controller performs a re-read operation with respect to the memory cells. The re-read operation is performed using an adjusted (e.g., updated) voltage threshold based on the voltage threshold adjustment value (e.g., the second voltage threshold adjustment value) determined as part of the voltage threshold convergence calibration (e.g., the second calibration operation) at operation 840.

At operation 846, the controller determines a value of the metric (e.g., CFBit or CFByte) associated with the data sensed at operation 844. The value of the metric may be used in the next subsequent voltage threshold convergence calibration (e.g., a subsequent iteration of operation 840).

At operation 852, the controller determines whether the voltage threshold has converged on a value. Operation 852 may be similar to operation 843 in some embodiments. If the voltage threshold has converged, the method may be finished. If the voltage threshold has not converged, the method may proceed to operation 854.

At operation 854, the controller selects another subset of memory cells to read. The another subset of memory cells may belong to the same memory block family as the initial subset of memory cells. In some embodiments, the failure of the voltage threshold to converge is due to an error inherent in the previously-selected memory cells. A new set of memory cells can be analyzed to perform the calibration operations described herein. In some embodiments, operation 854 corresponds to operation 712 of FIG. 7. After performing operation 854, the method 800B may be finished.

Figure 9:
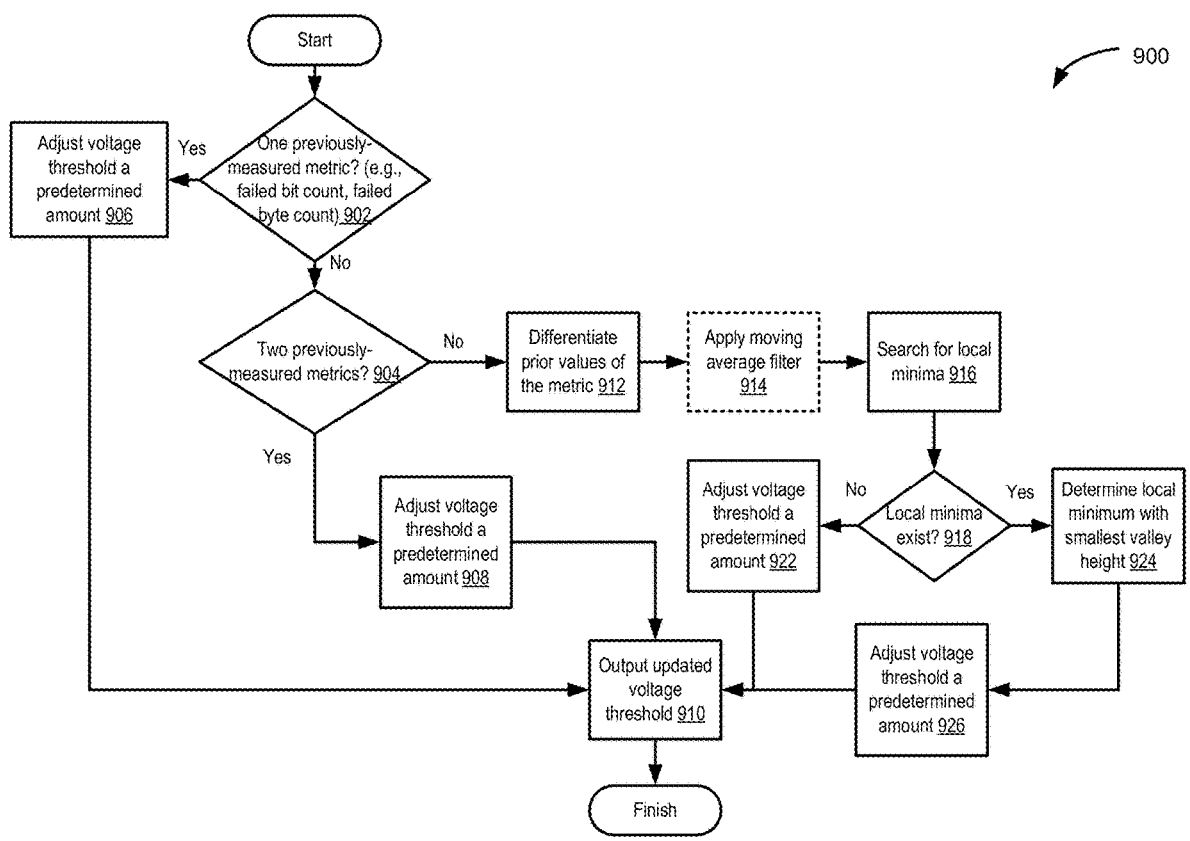
FIG. 9 is a flow diagram of an example calibration operation for calibrating read voltage thresholds in memory devices, in accordance with embodiments of the present disclosure.

FIG. 9 is a flow diagram of an example method 900 of an example calibration operation for calibrating read voltage thresholds in memory devices, in accordance with embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 900 is performed by the memory sub-system controller 115 and/or the local media controller 135 of FIG. 1.

In some implementations, the method 900 can be performed in anticipation of a read command, in order to calibrate prior to the read command. In some implementations, the method 900 can be performed by the media controller, and voltage threshold adjustment can be performed to track voltage loss (e.g. of the memory cells) over time. In some embodiments, data is not transferred during the performance of method 900. In some embodiments, the method 900 is performed in association with method 700 of FIG. 7, method 800A of FIG. 8A, and/or method 800B of FIG. 8B.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 902, the controller implementing the method 900 may determine whether there has been only one previously measured value of the metric (e.g., CFBit, CFByte, etc.). The previously measured value of the metric may have been determined during an operation related to a voltage threshold calibration based on the metric (e.g., at operation 810 of FIG. 8A). If the controller determines that there is only one previously measured value of the metric, the method proceeds to operation 906. If the controller determines that there are two or more previously measured values of the metric (e.g., that there is more than one previously measured value of the metric), the method proceeds to operation 904.

At operation 904, the controller determines whether there are only two previously measured values of the metric. The previously measured values of the metric may have been determined during multiple operations related to multiple iterations of a voltage threshold calibration based on the metric. If the controller determines that there are not only two previously measured values of the metric (e.g., that there are more than two previously measured values of the metric), the method proceeds to operation 912. If the controller determines that there are only two previously measured values of the metric, the method proceeds to operation 908.

Figure 11B:
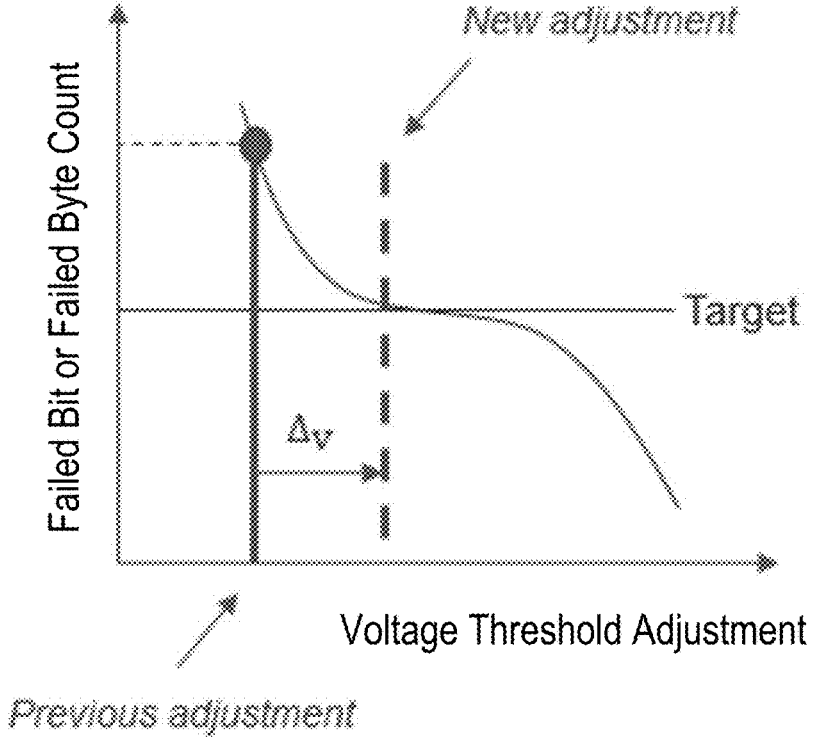
Figure 11C:
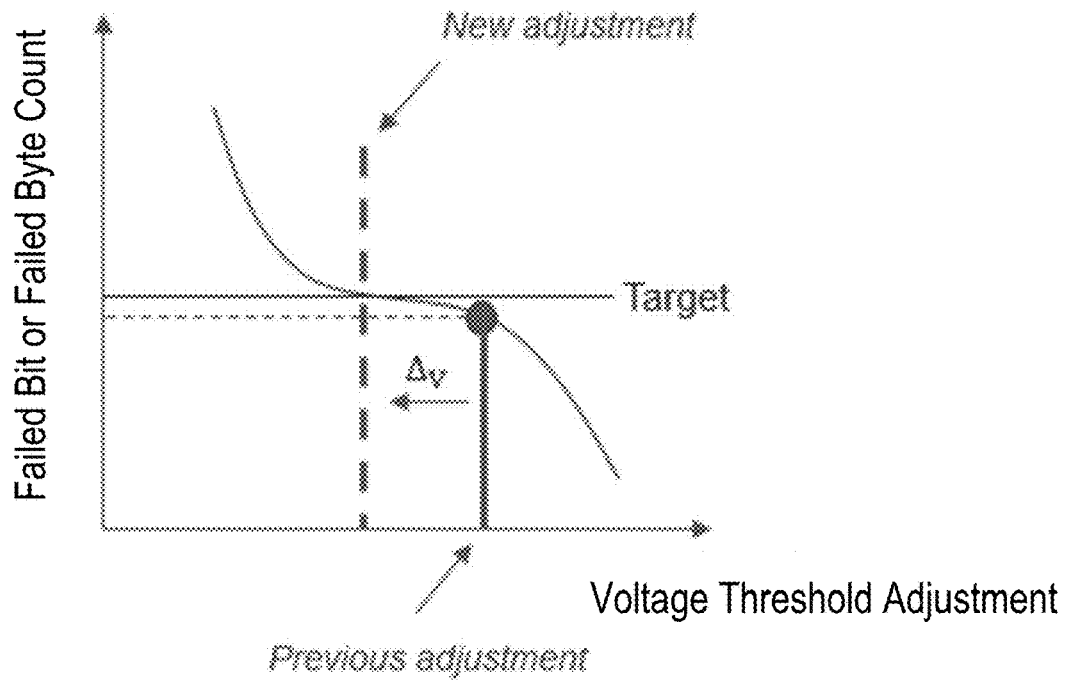

At operation 906, the controller adjusts the voltage threshold by a predetermined amount (e.g., $\Delta V$), which can be specified as a parameter of the method (e.g., retrieved from the metadata area of the memory device). In some embodiments, the predetermined amount by which the voltage threshold is adjusted is about 150 millivolts. In some embodiments, the predetermined amount can be any voltage between about 100 millivolts and 200 millivolts. However, it should be recognized to one of ordinary skill in the art that other voltage values outside the previously described range can be used as $\Delta V$. In some embodiments, the voltage threshold may be adjusted to correspond with increasing or decreasing the metric toward the predetermined target value of the metric. Referring to FIG. 11B, a diagram illustrating a method of calibrating a voltage threshold in a memory device is shown in accordance with embodiments of the present disclosure. Where the value of the metric (e.g., failed bit count or failed byte count) is higher than the target value of the metric, the voltage threshold may be increased by $\Delta V$, as shown in FIG. 11B. Similarly, referring to FIG. 11C, a diagram illustrating a method of calibrating a voltage threshold in a memory devices is shown in accordance with embodiments of the present disclosure. Where the value of the metric is lower than the target value of the metric, the voltage threshold may be decreased by $\Delta V$, as shown in FIG. 11C.

Figure 11D:
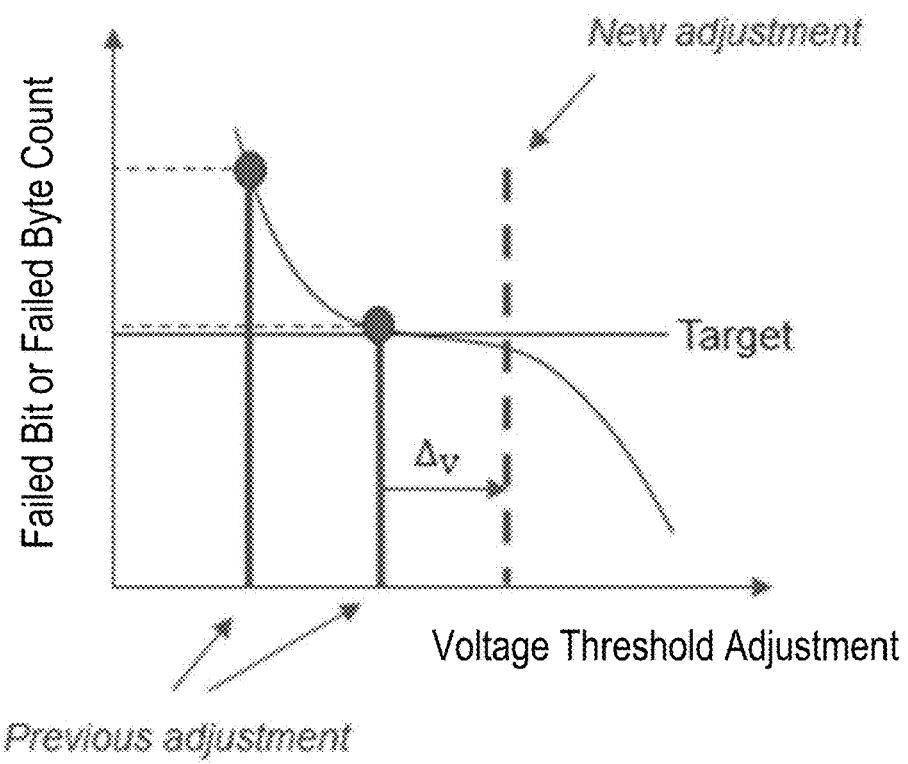
Figure 11E:
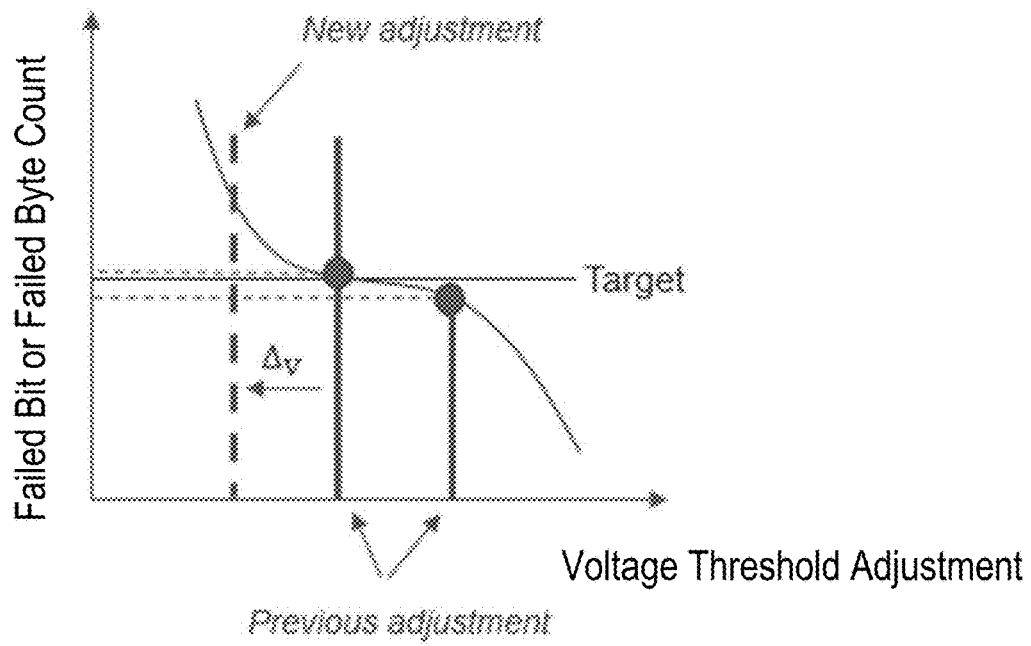

Referring again to FIG. 9, at operation 908, the controller may adjust the voltage threshold by the predetermined amount (e.g., $\Delta V$). Whether the predetermined amount is added to or subtracted from the read voltage level may be dependent upon the prior two measurements of the value of the metric in relation to the target value of the metric. Referring to FIGS. 11D-11E, diagrams illustrating methods of calibrating voltage thresholds in memory devices are shown in accordance with embodiments of the present disclosure. Where the two prior measured values of the metric are greater than the target value of the metric, ΔV may be added to the voltage threshold that corresponds to the prior measure of the value of the metric that most closely matches the target value of the metric to form the adjusted voltage threshold, as shown in FIG. 11D. Similarly, where the two prior measured values of the metric are less than the target value of the metric, ΔV may be subtracted from the voltage threshold that corresponds to the prior measure of the value of the metric that most closely matches the target value of the metric to form the adjusted voltage threshold, as shown in FIG. 11E. In a further example, where one measured value of the metric is less than the target value of the metric and the other measured value of the metric is greater than the target value of the metric and the greater measured value of the metric most closely matches the target value of the metric, ΔV is subtracted from the voltage threshold that corresponds to the greater measured value of the metric to form the adjusted voltage threshold. Similar to the immediately previous example, where the lesser measured value of the metric most closely matches the target value of the metric, ΔV is added to the voltage threshold that corresponds to the lesser measured value of the metric to form the adjusted voltage threshold.

At operation 910, the controller may output the adjusted voltage threshold. The adjusted voltage threshold may be used for reading data stored in the memory cells.

At operation 912, the controller may differentiate (e.g., determine differences of) the prior measured values of the metric (e.g., prior measurements of CFBit or CFByte). For example, the controller may cause the differences between prior measurements of values of the metric to be determined. In some embodiments, the controller determines the absolute value of the differentiated prior values of the metric.

At operation 914, optionally, the controller may apply a moving average filter to the differentiated values of the metric determined at operation 912 (e.g., to the absolute values of the differentiated values of the metric). Alternatively, another filter may be applied to eliminate (e.g., substantially eliminate) noise in the measured values of the metric.

At operation 916, the controller may search for local metric minima. For example, a local metric minimum may correspond to the minimum value of the differentiated values of the metric (e.g., the minimum absolute value of the differentiated measured values of the metric).

Figure 11F:
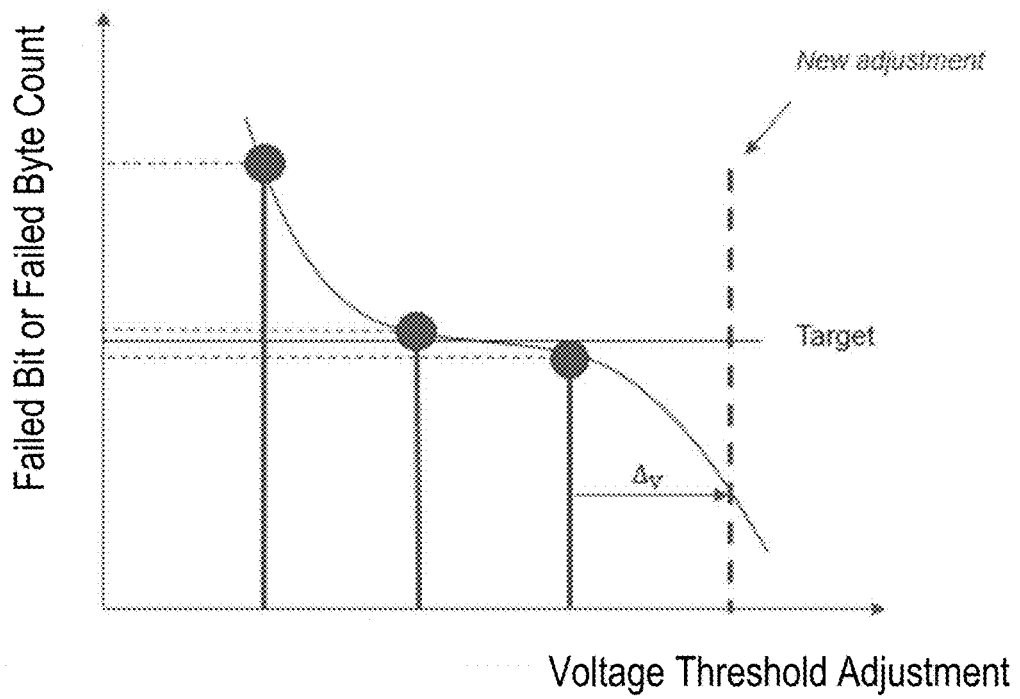
Figure 11G:
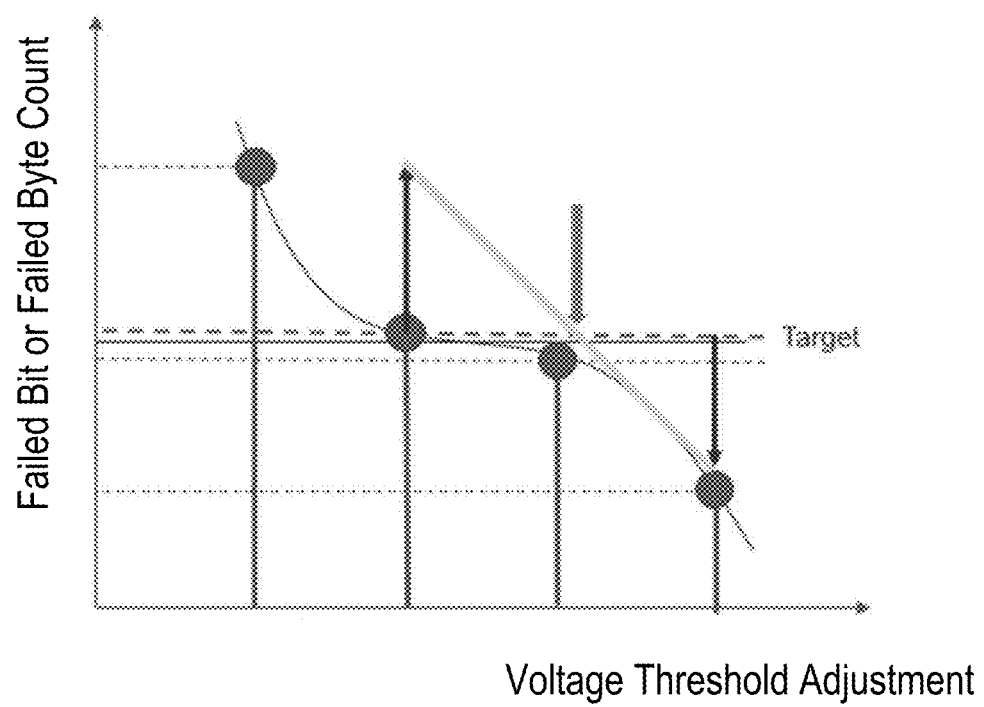

At operation 918, the controller may determine whether a local minimum exists. Referring to FIG. 11G, a diagram illustrating a method of calibrating voltage thresholds in memory devices is shown, in accordance with embodiments of the present disclosure. In some examples, four read strobes are performed before a local minimum can be found. The four read strobes may correspond to three values of differentiated values of the metric. In some examples, a local minimum may exist when the differentiated values of the metric decreases with increasing voltage threshold to a minimum, then increases with increasing voltage threshold, as shown in FIG. 11G. A local minimum may correspond to the solid dot nearest the downward pointing arrow shown in FIG. 11G. In some examples, a local minimum may exist when the differentiated values of the metric increases with increasing voltage threshold. In some examples, a local minima may exist when there exists a minimum value of the differentiated metric. In some examples, a local minima may exist when the differentiated metric is constant. If a local minima exists, the method may proceed to operation 924. If no local minima exists, the method may proceed to operation 922.

Referring back to FIG. 9, at operation 922, the controller may adjust the voltage threshold a predetermined amount (e.g., ΔV). Referring to FIG. 11F, a diagram illustrating a method of calibrating voltage thresholds in memory devices is shown, in accordance with embodiments of the present disclosure. In some examples, where the measure of the metric decreases with increased voltage threshold, ΔV is added to the highest previous voltage threshold to form the adjusted voltage threshold, as shown in FIG. 11F. In some examples, where the measure of the metric increases with increased voltage threshold, ΔV is subtracted from the lowest previous voltage threshold to form the adjusted voltage threshold, opposite to as shown in FIG. 11F.

Referring back to FIG. 9, at operation 924, the controller may determine the local minimum with the smallest valley height (e.g., with the smallest difference between the local minimum metric differential value and adjacent metric differential values). In some embodiments, the controller may perform linear interpolation to determine the local minimum. For example, the controller may determine the minimum based on the differentiated values of the metric. The differentiated values may be used to interpolate between points to determine the local minimum and/or to determine the location of the local minimum.

At operation 926, the controller may adjust the voltage threshold based on the differentiated values of the metric measurements. Referring to FIG. 11G, a diagram illustrating a method of calibrating voltage thresholds in memory devices is shown, in accordance with embodiments of the present disclosure. In some examples, linear interpolation can be used to determine an adjusted voltage threshold based on the previously measured values of the metric, the corresponding previous voltage thresholds, and/or the predetermined target value of the metric, as shown in FIG. 11G. For example, the bolded downwards pointing arrow of FIG. 11G may correspond to a final adjusted voltage threshold determined based on linear interpolation.

Figure 10:
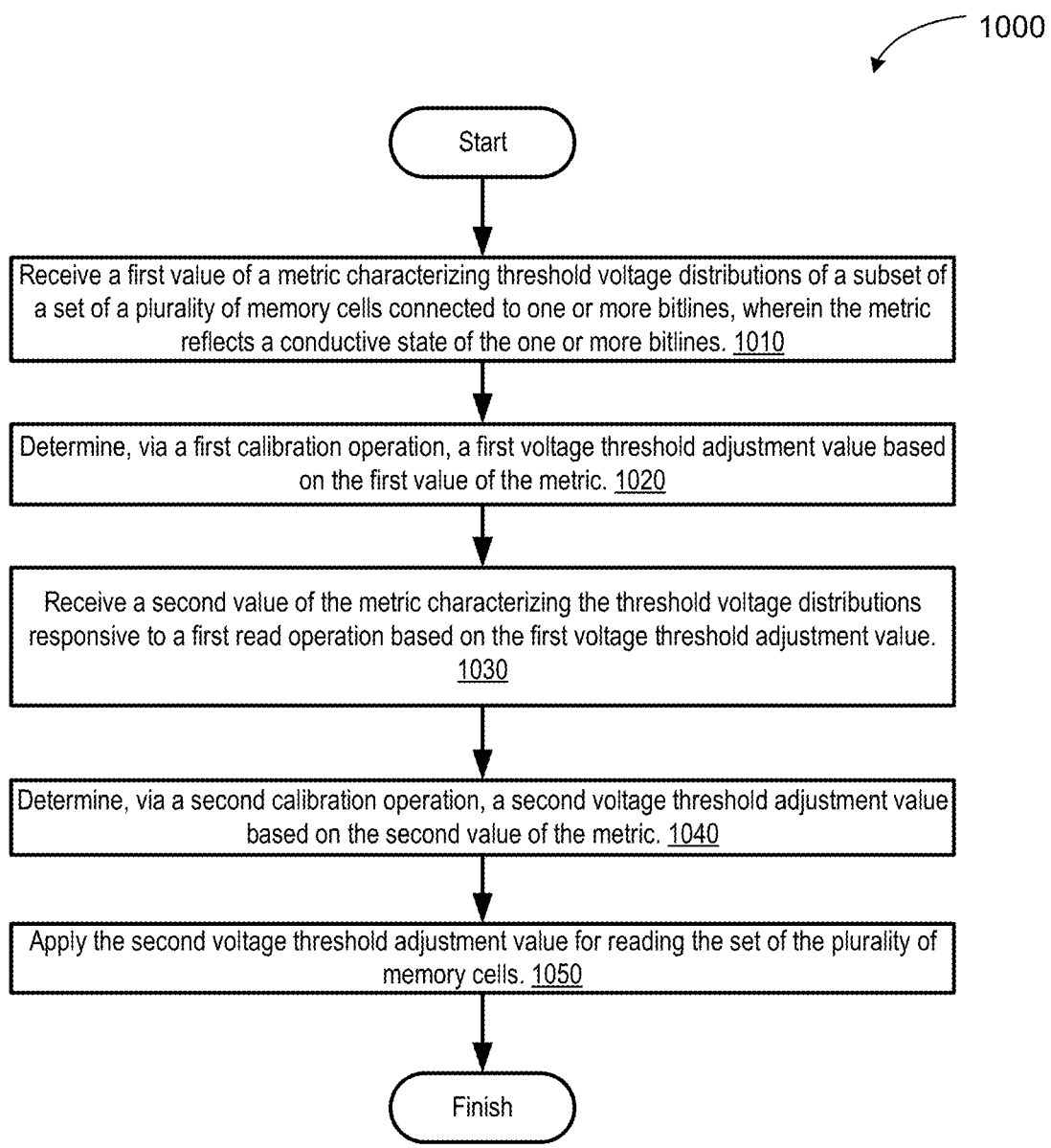
FIG. 10 is a flow diagram of an example method of calibrating read voltage thresholds in memory devices, in accordance with embodiments of the present disclosure.

FIG. 10 is a flow diagram of an example method 1000 of calibrating read voltage thresholds in memory devices, in accordance with embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 1000 is performed by the memory sub-system controller 115 and/or the local media controller 135 of FIG. 1.

In some implementations, the method 1000 can be performed in anticipation of a read command, in order to calibrate prior to the read command. In some implementations, the method 1000 can be performed by the media controller, and voltage threshold adjustment can be performed to track voltage loss (e.g., of the memory cells) over time. In some embodiments, data is not transferred during the performance of method 1000.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 1010, the controller implementing the method 1000 may receive a first value of a metric characterizing threshold voltage distributions of a subset of a set of a plurality of memory cells. The memory cells may be connected to one or more bitlines of a memory device. The metric reflects a conductive state of the one or more bitlines. In some embodiments, the metric is a failed byte count (e.g., CFByte) or a failed bit count (e.g., CFBit) as described herein.

At operation 1020, the controller may determine, via a first calibration operation, a first voltage threshold adjustment value based on the first value of the metric. The first calibration operation may be a voltage threshold calibration operation based on the value of the metric (e.g., at operation 704 of FIG. 7).

At operation 1030, the controller may receive a second value of the metric characterizing the threshold voltage distributions. The second metric may be received responsive to a first read operation based on the first voltage threshold adjustment value. For example, the first read operation may be performed with respect to the subset of the set of the plurality of memory cells responsive to the determining of the first voltage threshold adjustment value. In some examples, the voltage threshold of the first read operation is based on the first voltage threshold adjustment value (e.g., a previous voltage threshold is adjusted by the first voltage threshold adjustment value to form the voltage threshold of the first read operation). The second value of the metric reflects the conductive state of the one or more bitlines. In some embodiments, the first read operation is performed without the transfer of data.

At operation 1040, the controller may determine, via a second calibration operation, a second voltage threshold adjustment value based on the second value of the metric. The second calibration operation may be a voltage threshold convergence calibration (e.g., at operation 706 of FIG. 7). In some embodiments, the second calibration operation may be iterative. For example, the second calibration operation may be performed multiple times to adjust the voltage threshold. The second calibration operation may include determining a third value of the metric during one or more iterations. The second voltage threshold adjustment value may be determined further based on the third value of the metric. Through multiple iterations of the second calibration operation, a final voltage threshold may be converged upon.

At operation 1080, the controller may apply the second voltage threshold adjustment value for reading the set of the plurality of memory cells. For example, the controller may utilize the second voltage threshold adjustment value for determining a voltage threshold to be used for reading the set of the plurality of memory cells. The second voltage threshold adjustment value may be based (e.g., at least in part) on the first voltage threshold adjustment value.

FIGS. 11A-G are diagrams illustrating methods of calibrating read voltage thresholds in memory devices, in accordance with embodiments of the present disclosure. Certain embodiments are described herein above with reference to one or more of FIGS. 11A-I. FIGS. 11A-I show plots of failed bit count (e.g., CFBit) against read voltage level (e.g., read adjustment, read voltage level adjustment).

Figure 12:
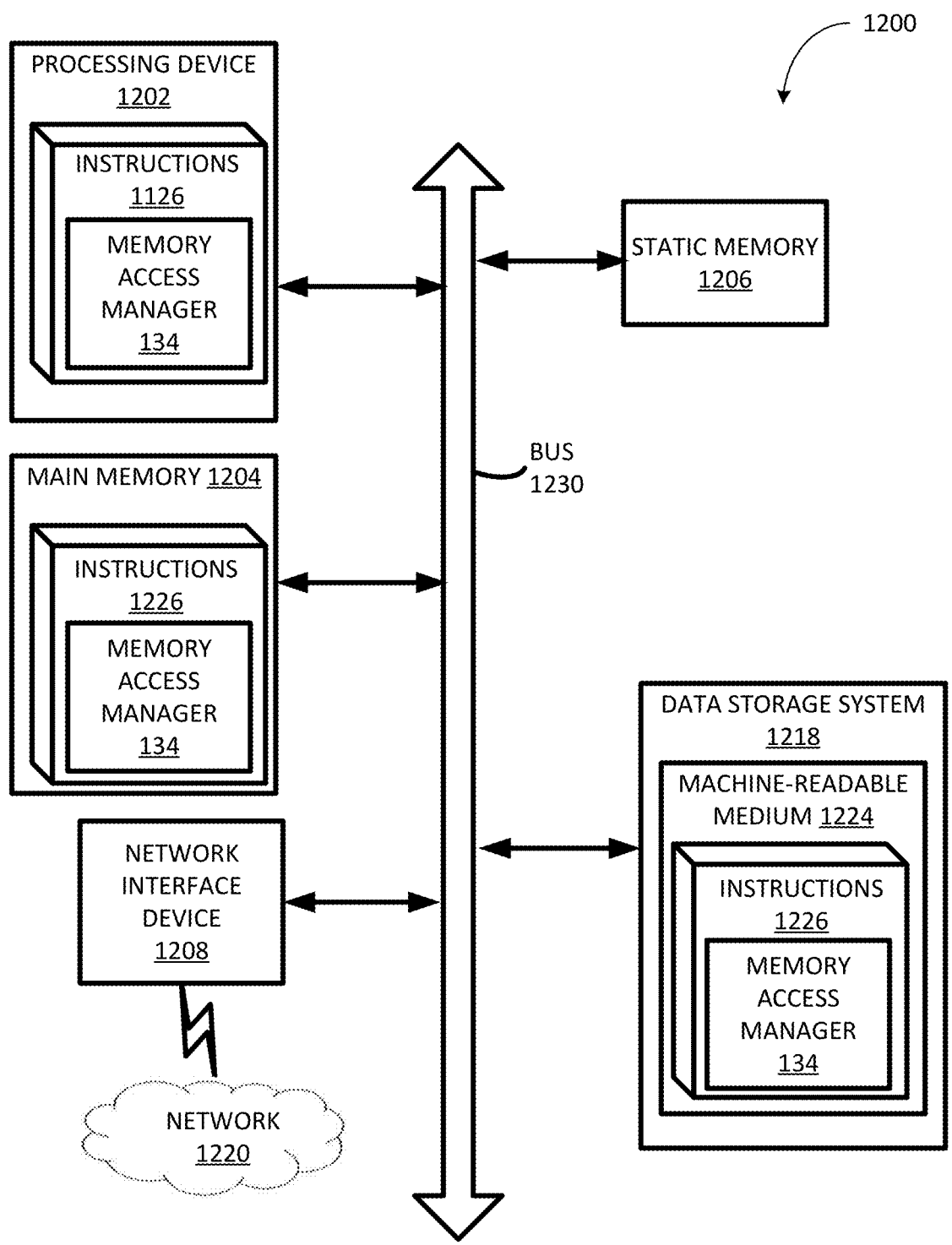
FIG. 12 is a block diagram of an example computer system in which embodiments of the present disclosure can operate.

FIG. 12 illustrates an example machine of a computer system 1200 within which a set of instructions, for causing the machine to perform any one or more of the methods discussed herein, can be executed. In some implementations, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to memory access manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methods discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium, such as a computer-readable non-transitory storage medium, a) on which is stored one or more sets of executable instructions 1226 or software embodying any one or more of the methods or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to memory access manager 134 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methods of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of memory cells; and
   a controller coupled to the memory array, the controller configured to:
   receive a first value of a metric characterizing threshold voltage distributions of a subset of a set of the plurality of memory cells connected to one or more bitlines, wherein the metric reflects a conductive state of the one or more bitlines;
   determine, via a first calibration operation, a first voltage threshold adjustment value based on the first value of the metric;
   receive a second value of the metric characterizing the threshold voltage distributions of the subset of the set of the plurality of memory cells connected to the one or more bitlines responsive to a first read operation performed with respect to the subset of the set of the plurality of memory cells based on the first voltage threshold adjustment value;
   determine, via a second calibration operation, a second voltage threshold adjustment value based on the second value of the metric; and
   apply the second voltage threshold adjustment value for reading the set of the plurality of memory cells.

2. The memory device of claim 1, wherein to perform the second calibration operation, the controller is to:
   apply the first voltage threshold adjustment value for reading the subset of the set of the plurality of memory cells; and
   determine a third value of the metric based on a result of the reading, wherein the second voltage threshold adjustment value is determined further based on the third value of the metric.

3. The memory device of claim 1, wherein to perform the second calibration operation, the controller is to:
   apply one or more voltage threshold adjustments based on at least the second value of the metric, wherein to perform each of the one or more voltage threshold adjustments, the controller is to adjust the voltage threshold a predetermined amount.

4. The memory device of claim 1, wherein to determine the second voltage threshold adjustment value, the controller is to:
   apply a predefined mathematical transformation to the second value of the metric.

5. The memory device of claim 1, wherein the conductive state of the one or more bitlines reflected by the metric is provided by a failed byte count or a failed bit count.

6. The memory device of claim 1, wherein the controller is to receive the first metric is responsive to a read operation performed with respect to the subset of the set of the plurality of memory cells.

7. The memory device of claim 1, wherein the subset of the set of the plurality of memory cells comprises at least a portion of a memory page.

8. The memory device of claim 1, wherein to determine the first voltage threshold adjustment value, the controller is to:
identify, in a data structure, an entry mapping the first metric to a corresponding voltage threshold adjustment value.

9. A computer-readable non-transitory storage medium comprising executable instructions that, when executed by a controller managing a memory device, cause the controller to:
receive a first value of a metric characterizing threshold voltage distributions of a subset of a set of a plurality of memory cells connected to one or more bitlines, wherein the metric reflects a conductive state of the one or more bitlines;
determine, via a first calibration operation, a first voltage threshold adjustment value based on the first value of the metric;
receive a second value of the metric characterizing the threshold voltage distributions of the subset of the set of the plurality of memory cells connected to the one or more bitlines responsive to a first read operation performed with respect to the subset of the set of the plurality of memory cells based on the first voltage threshold adjustment value;
determine, via a second calibration operation, a second voltage threshold adjustment value based on the second value of the metric; and
apply the second voltage threshold adjustment value for reading the set of the plurality of memory cells.

10. The computer-readable non-transitory storage medium of claim 9, wherein to perform the second calibration operation, the controller is to:
apply the first voltage threshold adjustment value for reading the subset of the set of the plurality of memory cells; and
determine a third value of the metric based on a result of the reading, wherein the second voltage threshold adjustment value is determined further based on the third value of the metric.

11. The computer-readable non-transitory storage medium of claim 9, wherein to perform the second calibration operation, the controller is to:
apply one or more voltage threshold adjustments based on at least the second value of the metric, wherein to perform each of the one or more voltage threshold adjustments, the controller is to adjust the voltage threshold a predetermined amount.

12. The computer-readable non-transitory storage medium of claim 9, wherein to determine the second voltage threshold adjustment value, the controller is to:
apply a predefined mathematical transformation to the second value of the metric.

13. The computer-readable non-transitory storage medium of claim 9, wherein the conductive state of the one or more bitlines reflected by the metric is provided by a failed byte count or a failed bit count.

14. The computer-readable non-transitory storage medium of claim 9, wherein to determine the first voltage threshold adjustment value, the controller is to:
identify, in a data structure, an entry mapping the first metric to a corresponding voltage threshold adjustment value.

15. A method comprising:
receiving a first value of a metric characterizing threshold voltage distributions of a subset of a set of a plurality of memory cells connected to one or more bitlines, wherein the metric reflects a conductive state of the one or more bitlines;
determining, via a first calibration operation, a first voltage threshold adjustment value based on the first value of the metric;
receiving a second value of the metric characterizing the threshold voltage distributions of the subset of the set of the plurality of memory cells connected to the one or more bitlines responsive to a first read operation performed with respect to the subset of the set of the plurality of memory cells based on the first voltage threshold adjustment value;
determining, via a second calibration operation, a second voltage threshold adjustment value based on the second value of the metric; and
applying the second voltage threshold adjustment value for reading the set of the plurality of memory cells.

16. The method of claim 15, wherein the second calibration operation comprises:
applying the first voltage threshold adjustment value for reading the subset of the set of the plurality of memory cells; and
determining a third value of the metric based on a result of the reading, wherein the second voltage threshold adjustment value is determined further based on the third value of the metric.

17. The method of claim 15, wherein the second calibration operation comprises:
applying one or more voltage threshold adjustments based on at least the second value of the metric, wherein each of the one or more voltage threshold adjustments comprise adjusting the voltage threshold a predetermined amount.

18. The method of claim 15, wherein determining the second voltage threshold adjustment value comprises:
applying a predefined mathematical transformation to the second value of the metric.

19. The method of claim 15, wherein the conductive state of the one or more bitlines reflected by the metric is provided by a failed byte count or a failed bit count.

20. The method of claim 15, wherein determining the first voltage threshold adjustment value comprises:
identifying, in a data structure, an entry mapping the first metric to a corresponding voltage threshold adjustment value.

* * * * *